United States Patent
Sato

(10) Patent No.: US 7,372,260 B2
(45) Date of Patent: May 13, 2008

(54) MAGNETIC SENSOR, AND METHOD OF COMPENSATING TEMPERATURE-DEPENDENT CHARACTERISTIC OF MAGNETIC SENSOR

(75) Inventor: Hideki Sato, Toyooka-mura (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 11/318,590

(22) Filed: Dec. 28, 2005

(65) Prior Publication Data

US 2006/0164079 A1 Jul. 27, 2006

Related U.S. Application Data

(62) Division of application No. 10/720,253, filed on Nov. 25, 2003, now Pat. No. 7,053,607.

(30) Foreign Application Priority Data

Nov. 29, 2002 (WO) ................. PCT/JP02/12476

(51) Int. Cl.
*G01R 33/09* (2006.01)
(52) U.S. Cl. .................... 324/252; 324/260
(58) Field of Classification Search ........ 324/207.21, 324/251, 252, 260
See application file for complete search history.

(56) References Cited

U.S. PATENT DOCUMENTS 5,351,003 A 9/1994 Bauer et al.
5,561,368 A 10/1996 Dovek et al.

(Continued)

FOREIGN PATENT DOCUMENTS

DE 196 49 265 A1 6/1998
DE 197 42 366 C1 5/1999

(Continued)

OTHER PUBLICATIONS

PCT Application PCT/JP02/12476 dated Nov. 29, 2002.

(Continued)

*Primary Examiner*—Reena Aurora
(74) *Attorney, Agent, or Firm*—Dickstein Shapiro LLP

(57) ABSTRACT

A magnetic sensor 10 includes GMR elements 11-18, and heating coils 21-24 serving as heat generating elements. The elements 11-14 and 15-18 are bridge-interconnected to constitute X-axis and Y-axis sensors, respectively. The heating coils 21, 22, 23, and 24 are disposed adjacent to the elements 11 and 12, the elements 13 and 14, the elements 15 and 16, and the elements 17 and 18, respectively. The heating coils 21-24, when electrically energized, heat mainly the adjacent elements. Therefore, the elements can be heated and cooled in a short period of time in which constant geomagnetism can be ensured. Data for compensation of temperature-dependent characteristic (ratio of change in sensor output value to variation in element temperature) is obtained on the basis of the temperatures of the elements before and after the heating, and the magnetic sensor outputs before and after the heating. Subsequently, the temperature characteristics of the elements are compensated on the basis of the data.

11 Claims, 17 Drawing Sheets

U.S. PATENT DOCUMENTS

| | | | |
|---|---|---|---|
| 6,252,395 B1 | 6/2001 | Aoyama et al. | |
| 6,707,298 B2 | 3/2004 | Suzuki et al. | |
| 6,831,456 B2 * | 12/2004 | Doescher | 324/207.21 |
| 6,937,012 B2 * | 8/2005 | Saito | 324/251 |
| 2003/0094944 A1 | 5/2003 | Suzuki et al. | |

FOREIGN PATENT DOCUMENTS

| | | |
|---|---|---|
| EP | 0 707 218 A2 | 4/1996 |
| JP | 59-159565 | 9/1984 |
| JP | 63-193866 | 12/1988 |
| JP | 3-221810 | 9/1991 |
| JP | 6-77558 | 3/1994 |
| JP | 6-232478 | 8/1994 |
| JP | 8-211138 | 8/1996 |
| JP | 8-226960 | 9/1996 |
| JP | 11-287668 | 10/1999 |
| JP | 2001-183433 | 7/2001 |

OTHER PUBLICATIONS

Hill et al., Sensors and Actuators A, vol. 59, pp. 30-37 (1997).

Ron Neale, "Taming the Giant MagnetoResistance (GMR) effect", Sensors, Electronic Engineering, pp. 36-40 (1996).

Smith et al., "The Growing Role of Solid-State Magnetic Sensing", Sensors Expo-Detroit, pp. 139-149 (1997).

Spong et al., "Giant Magnetoresistive Spin Valve Bridge Sensor", IEEE Transactions on Magnetics, vol. 32, No. 2, pp. 366-371 (1996).

Daughton et al., "Magnetic Field Sensors Using GMR Multilayer", IEEE Transactions on Magnetics, vol. 30, No. 6, pp. 4608-4610 (1994).

* cited by examiner

MAGNETIC SENSOR, AND METHOD OF COMPENSATING TEMPERATURE-DEPENDENT CHARACTERISTIC OF MAGNETIC SENSOR

CROSS-REFERENCE TO RELATED APPLICATIONS

This application is a division of U.S. application Ser. No. 10/720,253, filed Nov. 25, 2003, now U.S. Pat. No. 7,053,607 the entirety of which is incorporated herein by reference.

TECHNICAL FIELD

The present invention relates to a magnetic sensor utilizing a magnetoresistive element.

BACKGROUND ART

There has hitherto been known a magnetic sensor which utilizes a magnetoresistive element, such as a ferromagnetic magnetoresistive element (MR element), a giant magnetoresistive element (GMR element) or a tunnel magnetoresistive element (TMR element), as a magnetic field detecting element, and which, on the basis of a resistance value of the magnetoresistive element, generates an output value according to an external magnetic field acting on the magnetoresistive element.

The resistance value of a magnetoresistive element is dependent on temperature. Therefore, even when under a magnetic field of fixed magnitude, output value of the magnetic sensor varies with the temperature of the magnetoresistive element. Consequently, compensating this temperature dependence is an essential requirement for detecting (the magnitude of) a magnetic field with high precision.

A magnetic sensor apparatus described in Japanese Patent Application Laid-open (kokai) No. H06-77558 attains such compensation by means of a temperature sensor disposed adjacent to a magnetoresistive element. A relation between voltage, serving as an output value of the magnetic sensor, and temperature (temperature-dependent characteristic) is measured in advance and stored in a memory. Then, on the basis of an actual temperature detected by the temperature sensor and the relation stored in the memory, a reference voltage is determined, and a difference between an actual voltage output by the magnetic sensor and the determined reference voltage is amplified and output to thereby compensate the temperature-dependent characteristic of the magnetic sensor.

Meanwhile, the output value of a high sensitive magnetic sensor varies under an influence of geomagnetism, and geomagnetism varies with time. Consequently, the temperature-dependent characteristic stored in the memory of the above-mentioned magnetic sensor apparatus must to be measured within a predetermined short period of time in which geomagnetism is ensured not to change; and during the above-described measurement the magnetoresistive element must be heated or cooled within a short period of time.

However, if the above-mentioned magnetoresistive element is heated by an ordinary heating/cooling apparatus, not only the magnetoresistive element, but the entire magnetic sensor, including a substrate of the magnetoresistive element, is heated/cooled. Therefore, heating/cooling time would be long due to the large heat capacity of the magnetic sensor, and consequently geomagnetism would change during measurement of the temperature dependence. As a result, a problem would arise, in that the reliability of the temperature-dependent characteristic stored in the memory would be lowered, and consequently precise compensation of the temperature-dependent characteristic would be impossible. Although one feasible solution is to measure the temperature-dependent characteristic under an environment free from the influence of geomagnetism, an apparatus (magnetic field canceller) for establishing such environment is extremely expensive, thereby introducing another problem of increasing the manufacturing cost of the magnetic sensor.

Accordingly, an object of the present invention is to provide a magnetic sensor, which is capable of measuring a temperature-dependent characteristic inexpensively, within a short period of time, and with precision, and to provide a method for precisely compensating a temperature-dependent characteristic of a magnetic sensor.

Another object of the present invention is to provide a single-chip magnetic sensor which can generate an output signal of the magnetic sensor without using a connecting wire; e.g., an Au wire for connecting the magnetic sensor to external parts (for instance an external circuit).

Still another object of the present invention is to provide a magnetic sensor in which external noise exerts substantially no influence on a control circuit section which performs various operations such as generation of an output signal on the basis of a change in resistance of a magnetoresistive element, obtainment of data regarding the temperature characteristic of the magnetoresistive element, initialization of the magnetization of the free layer of the magnetoresistive element, and application of an external magnetic field to the magnetoresistive element for testing the performance of the magnetoresistive element.

A further object of the present invention is to provide a magnetic sensor having a structure suitable for fixing magnetization of pinned layers of a plurality of magnetoresistive elements in the same direction easily and reliably.

DISCLOSURE OF THE INVENTION

The present invention provides a magnetic sensor which comprises a plurality of magnetoresistive elements formed on an upper surface of a layer superposed on a substrate, and a plurality of heat generating elements adapted to generate heat when electrically energized, and which, on the basis of resistance values of the plurality of magnetoresistive elements, generates an output value corresponding to an external magnetic field acting on the magnetoresistive elements, wherein the plurality of heat generating elements are arranged and configured in such a way that, when each of the plurality of heat generating elements generates a quantity of heat approximately equal to the quantity of heat generated by any of the remaining heat generating elements, the temperatures of the plurality magnetoresistive elements become approximately equal to one another, and the temperature of the upper surface of the layer on which the plurality of magnetoresistive elements are formed becomes nonuniform (uneven). Examples of the magnetoresistive elements include MR elements, GMR elements, and TMR elements.

By virtue of the above-described arrangement and configuration, the entire magnetic sensor including the substrate is not heated to the same temperature; and the plurality of magnetoresistive elements are heated to approximately the same temperature (a temperature different from the substrate temperature). Thus, it becomes possible to shorten the period of time required for heating/cooling the magnetoresistive elements, so that the temperature-dependent characteristics of the magnetoresistive elements can be measured within a period of time in which the same geomagnetism acts on the magnetoresistive elements.

In this case, the plurality of magnetoresistive elements may be arranged to form a plurality of island-like element groups, each including a plurality of magnetoresistive elements which are identical in magnetic field detecting direction and arranged adjacent to each other on the upper surface of the layer; and the heat generating elements may be formed such that one is located above or beneath each element group. In this case, because the heating members can heat mainly the magnetoresistive elements, the period of time required for heating/cooling can be further shortened.

Preferably, each of the heat generating elements assumes the form of a coil (heating coil) capable of applying to the magnetoresistive elements formed above or beneath the heat generating element a magnetic field in a direction approximately identical with or approximately perpendicular to the magnetic field detecting direction of the magnetoresistive elements. In this case, the magnetic field whose direction is approximately identical with the magnetic field detecting direction of the magnetoresistive elements can be used as a test magnetic field for determining whether or not the magnetic sensor properly detects a magnetic field; and the magnetic field whose direction is approximately perpendicular to the magnetic field detecting direction of the magnetoresistive elements can be used as, for example, a magnetic field dedicated to initialization of the free layers of the magnetoresistive elements.

By virtue of this preferable structure, because the heat generating element (heating coil) can serve also as a coil (test coil or initialization coil) for generating a magnetic field whose direction is approximately identical with or approximately perpendicular to the magnetic field detecting direction of the magnetoresistive element, it becomes possible to minimize the cost of the magnetic sensor as a result of shortening the manufacturing process and reducing the number of masks used in the manufacturing process. Further, when this coil is electrically energized, measurement of the temperature-dependent characteristic of the magnetic sensor, a portion or entirety of testing of the magnetic sensor, and a portion or entirety of initialization of the magnetic sensor can be carried out simultaneously; therefore, the manufacturing (test) period of time can be shortened, thereby reducing manufacturing cost.

The present invention also provides a magnetic sensor which comprises a plurality of magnetoresistive elements formed on an upper surface of a layer superposed on a substrate, and a single heat generating element for generating heat when electrically energized, and which generates an output value corresponding to an external magnetic field acting on the magnetoresistive elements, on the basis of resistance values of the plurality of magnetoresistive elements, wherein the heat generating element is arranged and configured in such a manner that the temperatures of the plurality of magnetoresistive elements become approximately equal to one another, and that the temperature of the upper surface of the layer on which the plurality of magnetoresistive elements are formed becomes nonuniform.

By virtue of this alternative configuration as well, the entire magnetic sensor including the substrate is not heated to the same temperature; and the plurality of magnetoresistive elements are heated to approximately the same temperature (a temperature different from the substrate temperature). Thus, it becomes possible to shorten the period of time required for heating/cooling the magnetoresistive elements, so that the temperature-dependent characteristics of the magnetoresistive elements can be measured within a period of time in which the same geomagnetism acts on the magnetoresistive elements.

In this case, the heat generating element and the plurality of magnetoresistive elements may be configured in such a manner that the quantity of heat to be propagated from the heat generating element to an arbitrary one of the plurality of magnetoresistive elements becomes approximately identical with the quantity of heat to be propagated from the heat generating element to one of the remaining magnetoresistive elements.

The heat generating element and the plurality of magnetoresistive elements may be configured in such a manner that a relative positional relation between the heat generating element and an arbitrary one of the plurality of magnetoresistive elements becomes approximately identical with the relative positional relation between the heat generating element and one of the remaining magnetoresistive elements.

Preferably, the plurality of magnetoresistive elements are arranged separately in four islands spaced from one another on the upper surface of the layer superposed on the substrate, and are formed in such a way that, when the plurality of magnetoresistive elements are rotated within a plane parallel to the upper surface of the layer through 90° about a centroid of a quadrilateral figure defined by four straight lines each interconnecting approximate centers of adjacent islands, an arbitrary one of the islands becomes substantially aligned with a position which before the angular movement through 90° had been occupied by another island that is adjacent to the arbitrary island in the direction of the angular movement.

Further, the magnetic sensor having any of the above-mentioned features may further comprise a temperature detecting section that outputs, as a detection temperature, a temperature having a constant correlation with Ihe temperature of at least one of the plurality of magnetoresistive elements when the temperatures of the plurality of magnetoresistive elements become approximately equal to one another, and the temperature of the upper surface of the layer on which the plurality of magnetoresistive elements are formed becomes nonuniform.

As described above, the magnetoresistive elements are heated to approximately the same temperature as a result of heat radiation of the heat generating element(s). Therefore, in the case in which the temperature detecting section has a constant correlation with at least one of the plurality of magnetoresistive elements in terms of temperature, the temperature detecting section can detect the temperatures of substantially all the magnetoresistive elements of the same configuration. Therefore, according to the above-mentioned configuration, the temperature detecting section is not required to be increased in number, and thus the cost of the magnetic sensor can be reduced.

Further, in the magnetic sensor including the above-mentioned temperature detecting section, preferably, the plurality of magnetoresistive elements are interconnected in such a way that, among the magnetoresistive elements, elements identical in magnetic field detecting direction constitute a bridge circuit in order to generate an output value corresponding to said external magnetic field; and the magnetic sensor further comprises a memory, and temperature-dependent characteristic writing means for writing into the memory a value that is determined on the basis of "data representing a first temperature of the magnetoresistive elements, determined on the basis of the detection temperature output from the temperature detecting section, and a first output value output from the magnetic sensor at the first temperature," and "data representing a second temperature of the magnetoresistive elements, different from the first temperature and determined on the basis of the detection temperature output from the temperature detecting section, and a second output value output from the magnetic sensor at the second temperature," the value to be written into the memory corresponding to a ratio of a difference between the first and second output values to a difference between the first and second temperatures.

The temperature-dependent characteristic of a magnetic sensor in which a plurality of magnetoresistive elements constitutes a bridge circuit (full-bridge circuit) is such that the output of the magnetic sensor changes in proportion to the variation in temperature of the magnetoresistive element. Therefore, if a value corresponding to the above-described "ratio" (i.e., variation in output value of the magnetic sensor with respect to variation in temperature of the magnetoresistive element), which value may be the ratio itself, the inverse of the ratio, etc., is stored in advance in a memory, an electronic apparatus can obtain data of the temperature-dependent characteristic of the magnetic sensor by reading the "ratio" from the memory after the magnetic sensor is mounted in the electronic apparatus. Therefore, the data can be used to compensate the temperature-dependent characteristic of the magnetic sensor.

In other words, data regarding the temperature-dependent characteristic of each magnetic sensor can be held in the magnetic sensor through a simple operation of storing a value corresponding to the above-described "ratio" in the memory of the magnetic sensor. Therefore, it is possible to minimize the capacity of the memory in which data of the temperature-dependent characteristic of the magnetic sensor is to be stored, thereby lowering the cost of the magnetic sensor.

The present invention further provides a method of compensating a temperature-dependent characteristic of a magnetic sensor which includes a magnetoresistive element whose resistance varies according to an external magnetic field, a first memory, a temperature detecting section for outputting, as a detection temperature, a temperature having a constant correlation with the temperature of the magnetoresistive element, and a heat generating element for generating heat when electrically energized; and which generates an output value corresponding to the external magnetic field on the basis of a resistance value of the magnetoresistive element; the magnetic sensor being adapted for incorporation in an electronic apparatus which includes a permanent magnet component, a casing, and a second memory, wherein the casing accommodates the magnetic sensor, the permanent magnet component, and the second memory; the method comprising the steps of: obtaining a first temperature of said magnetoresistive element on the basis of the detection temperature output from said temperature detecting section, and obtaining a first output value output from said magnetic sensor at the first temperature, before said magnetic sensor is accommodated in said casing; changing the electrically energized state of said heat generating element, before said magnetic sensor is accommodated in said casing; obtaining a second temperature of said magnetoresistive element on the basis of the detection temperature output from said temperature detecting section, and obtaining a second output value output from said magnetic sensor at the second temperature, before said magnetic sensor is accommodated in said casing; storing into the first memory a value corresponding to a ratio of a difference between the first and second output values to a difference between the first and second temperatures; storing into the second memory, as reference data, an offset value of the output value of the magnetic sensor and a detection temperature output from the temperature detecting section after the magnetic sensor is accommodated in the casing together with the permanent magnet component; and thereafter, correcting the output value of the magnetic sensor on the basis of the value corresponding to the ratio stored in the first memory, the reference data stored in the second memory, and the detection temperature output from the temperature detecting section.

By this method, data to obtain a value corresponding to the above-described "ratio," serving as data representing the temperature-dependent characteristic of the magnetic sensor, is obtained and/or stored into the first memory in a stage in which the magnetic sensor has not yet been mounted in an electronic apparatus. Then, after the magnetic sensor is accommodated in the casing together with the permanent magnet component and the second memory, an offset value of the output value of the magnetic sensor and a temperature detected by the temperature detecting section when the offset value is obtained are stored into the second memory. Subsequently, the actual output value of the magnetic sensor is corrected on the basis of a difference between an actual temperature detected by the temperature detecting section and the temperature stored in the second memory, the value corresponding to the "ratio" and stored in the first memory, and the offset value stored in the second memory.

Note that said storing into the first memory the value corresponding to the ratio may be carried out even after the magnetic sensor is accommodated in the casing.

This method will be described by use of a specific example. The difference between an actual temperature detected by the temperature detection section and the temperature stored in the second memory is multiplied by the "ratio" stored in the first memory so as to obtain an amount of change in offset value resulting from variation in temperature of the magnetic sensor. Subsequently, the offset value stored in the second memory is added to the amount of change in offset value so as to obtain an after-temperature-change offset value; and a difference between the actual output value of the magnetic sensor and the after-temperature-change offset value is used as a value corresponding to an external magnetic field to be detected.

Thus, according to the temperature-dependent characteristic compensating method of the present invention, a value according to the above-described "ratio" is measured in a stage in which the magnetic sensor has not yet been mounted in an electronic apparatus, and stored into the first memory. Therefore, the magnetic sensor itself can possess data representing the temperature-dependent characteristic of the magnetic sensor. Further, because the offset value and the detection temperature output from the temperature detecting section are stored into the second memory after the magnetic sensor is mounted in the casing of an electronic apparatus together with the permanent magnet component, there is no need to store into the first memory the offset value of the magnetic sensor itself and the detection temperature output from the temperature detection section when the offset value is obtained. Therefore, the storage capacity of the first memory can be minimized to thereby lower the cost of the magnetic sensor. Moreover, since two types of offsets of the magnetic sensor; i.e., an offset (reference shift) of the magnetic sensor itself stemming from the individual difference (difference in resistance value) of the magnetoresistive element and an offset (reference shift) attributable to a leakage magnetic field from the permanent magnet component, can be obtained simultaneously after the magnetic sensor is mounted in the casing, there is no need to obtain the offset value twice. Thus, according to the present invention, the temperature-dependent characteristic of the magnetic sensor can be compensated in a simple manner.

The present invention also provides a magnet sensor comprising a single substrate, a plurality of magnetoresistive elements, a wiring section interconnecting the plurality of magnetoresistive elements, and a control circuit section for obtaining via the wiring section a physical quantity determined on the basis of resistance values of the plurality of magnetoresistive elements and processing the physical quantity so as to generate an output signal to be output to the outside, wherein the magnetic sensor further includes a plurality of layers superposed on the substrate; the magnetoresistive elements are formed on an upper surface of one of the plurality of layers; the wiring section and the control circuit section are formed in the substrate and the plurality of layers; and the magnetoresistive elements, the wiring section, and the control circuit section are interconnected in the plurality of layers by a connection section formed of a conductive substance and extending along a direction intersecting layer surfaces of the layers.

By virtue of this structure, the magnetoresistive elements, the wiring section, and the control circuit section are interconnected within the plurality of layers, without crossing, by the connection section which is formed of a conductive substance and extends along a direction intersecting the layer surfaces of the layers. Thus, there is provided a single-chip magnetic sensor which can generate an output signal of the magnetic sensor, without use of a connecting wire, unlike a magnetic sensor in which the chip is divided into a chip which carries magnetoresistive elements and a chip which carries a control circuit section, etc, and in which a connecting wire is used to connect the chips.

Further, the present invention provides a magnetic sensor comprising a substrate, a plurality of magnetoresistive elements disposed at an upper portion of the substrate, a wiring section disposed at the upper portion of the substrate and interconnecting the plurality of magnetoresistive elements, and a control circuit section for obtaining via the wiring section a physical quantity determined on the basis of resistance values of the plurality of magnetoresistive elements and processing the physical quantity so as to generate an output signal to be output to the outside, wherein the plurality of magnetoresistive elements are disposed at a peripheral portion of the substrate as viewed in plan; the wiring section is disposed so as to form substantially a closed curve as viewed in plan; and the control circuit section is disposed substantially inside the closed curve as viewed in plan.

By virtue of this configuration, the control circuit section for performing, for example, the generation of an output signal on the basis of a change in resistance of the magnetoresistive element or the obtaining of data of temperature characteristic of the magnetoresistive element, can be disposed within a compact space at the central portion of the substrate as viewed in plan. Therefore, the length of wiring in the control circuit section is shortened, and hence external noise can hardly be superposed on the wiring. As a result, there is provided a magnetic sensor which is hardly affected by external noise and is highly reliable.

Further, the present invention provides a magnetic sensor comprising a single substrate and a plurality of element groups, each element group including a pair of magnetoresistive elements which are identical in terms of magnetization direction of a pinned layer, wherein each of the plurality of element groups is disposed at an upper portion of the substrate in such a way that the magnetization direction of the pinned layer of each element group is substantially parallel to a direction in which a distance from a centroid (center) of the substrate increases, and such that the pair of magnetoresistive elements are disposed adjacent to each other in the last-named direction.

When the direction of magnetization of the pinned layer is being fixed, a magnetic field of stabilized direction and magnitude must be continually applied to the magnetoresistive element. At this time, at two neighboring points on the same line of magnetic force, the magnetic field assumes approximately the same magnitude in approximately the same direction. Further, in a magnetic sensor, on many occasions, in order to improve the temperature characteristic etc. of the magnetic sensor, a plurality of element groups each including a pair of magnetoresistive elements of identical pinned-layer magnetization direction (i.e., of identical magnetic field detecting direction) are provided, and these magnetoresistive elements are bridge-interconnected.

Therefore, in the case of the magnetic sensor configured in the above-described manner in which each of the plurality of element groups is disposed at an upper portion of the substrate such that the above-described pinned-layer magnetization direction is substantially parallel to the direction in which the distance from the centroid (center) of the substrate increases, as viewed in plan, and such that the pair of magnetoresistive elements are disposed adjacent to each other in that direction, when a magnetic field directed from the centroid (center) of the substrate toward its periphery acts on the magnetic sensor, magnetization of the pinned layer of the magnetoresistive elements can be fixed, by virtue of the magnetic field having the same magnitude and the same direction. As a result, the pinned layers of the magnetoresistive elements can be magnetized in the same direction easily and reliably.

BEST MODE FOR CARRYING OUT THE INVENTION

First Embodiment

Figure 1:
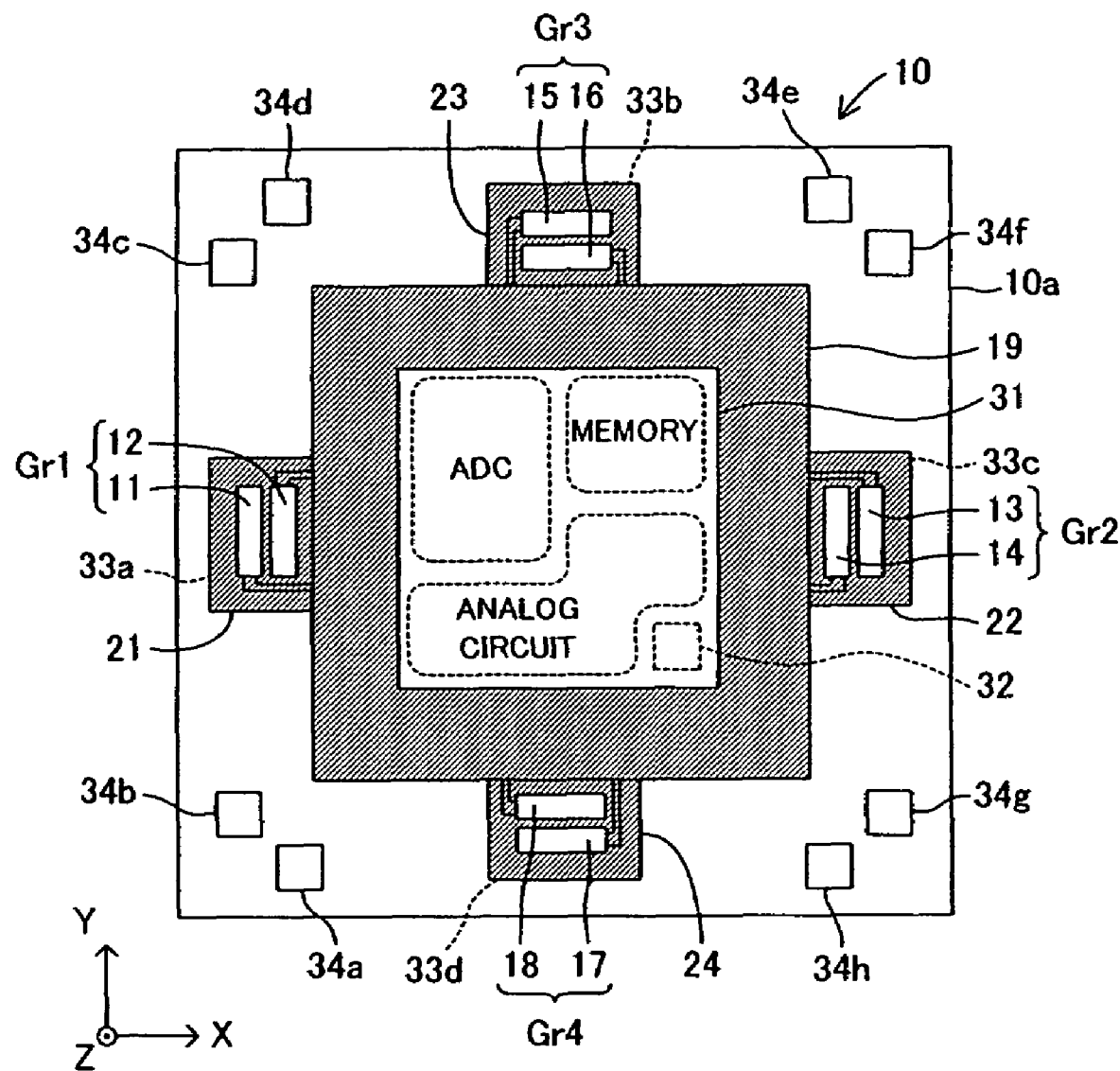
FIG. 1 is a schematic plan view of a magnetic sensor according to a first embodiment of the present invention.
Figure 2:
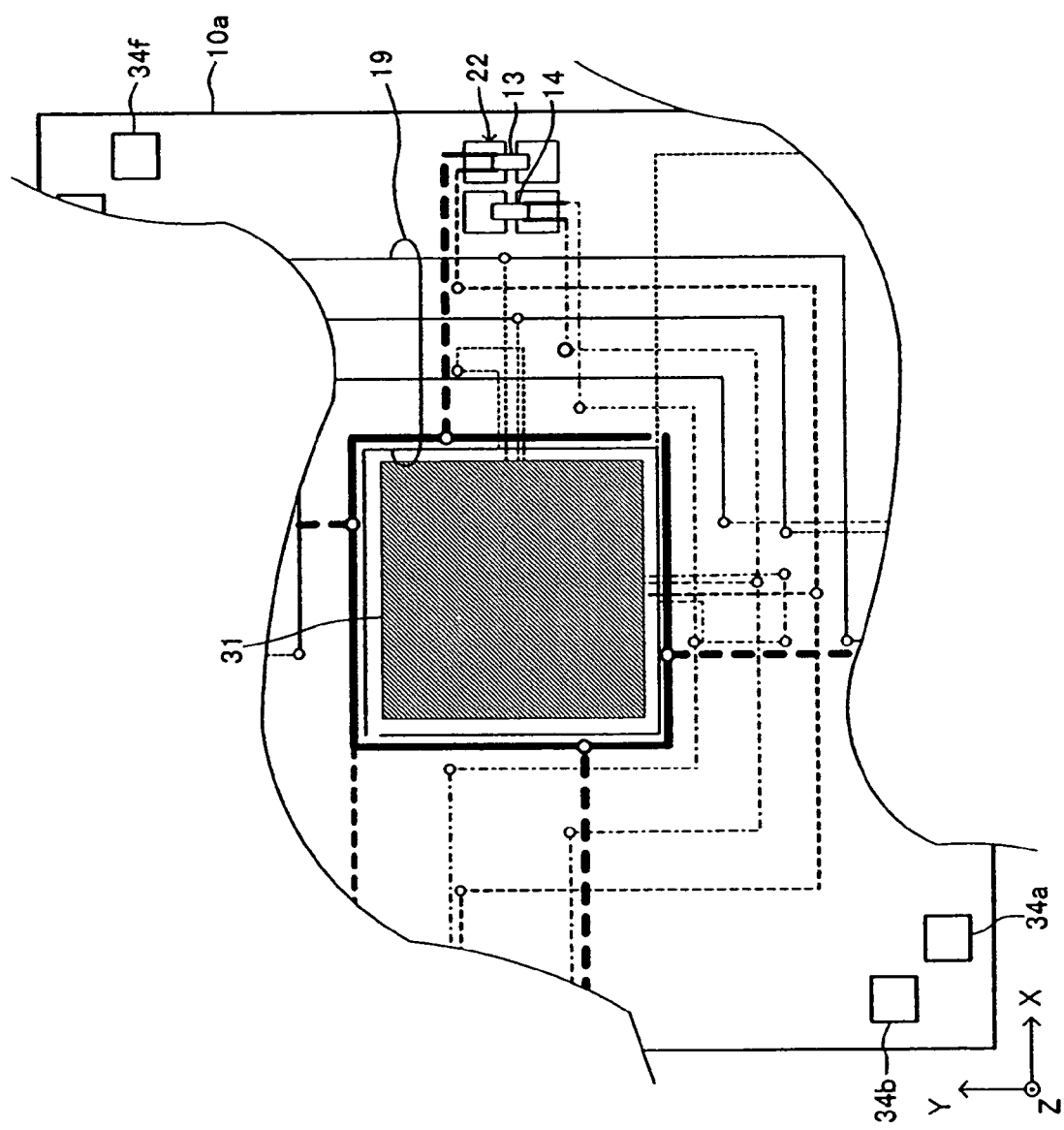
FIG. 2 is a schematic plan view of a portion of the magnetic sensor of FIG. 1, showing an electrical wiring state of the magnetic sensor.
Figure 3:
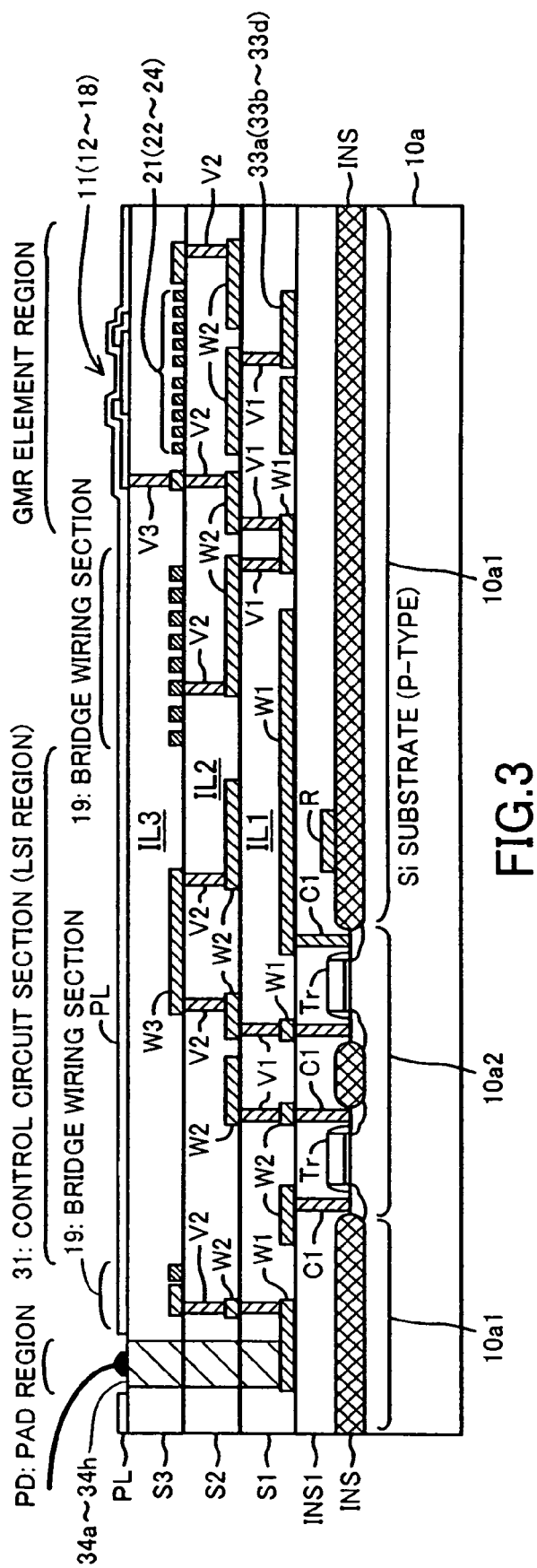
FIG. 3 is a schematic cross-sectional view of a portion of the magnetic sensor of FIG. 1, taken along a predetermined plane perpendicular to the surfaces of individual layers constituting the magnetic sensor.

Embodiments of a magnetic sensor according to the present invention will now be described with reference to the accompanying drawings. FIG. 1 is a schematic plan view of a magnetic sensor 10 according to a first embodiment; FIG. 2 is a schematic plan view of a portion of the magnetic sensor 10, showing the electrical wiring of the magnetic sensor 10; and FIG. 3 is a schematic cross-sectional view of a portion of the magnetic sensor shown in FIGS. 1 and 2, taken along a predetermined plane perpendicular to the surfaces of individual layers constituting the magnetic sensor 10.

The magnetic sensor 10 includes a substrate 10a which is formed of $Si_3N_4/Si$, $SiO_2/Si$, or quartz glass and which has an approximately square (or rectangular) shape with sides extending along mutually perpendicular X- and Y-axes and has a small thickness in a Z-axis direction perpendicular to the X- and Y-axes; layers INS1 and S1-S3 superposed on the substrate 10a and identical in shape with the substrate 10a as viewed in plan; a total of eight GMR elements 11-18 formed on (an upper surface of) the layer S3 as magnetoresistive elements; and a passivation layer PL formed as an uppermost surface.

As shown in FIG. 1, the magnetic sensor 10 has a bridge wiring section (connection wire section) 19 bridge-interconnecting the GMR elements 11-14 and the GMR elements 15-18, respectively, to constitute two full-bridge circuits; heating coils 21-24 serving as heating elements for heating the GMR elements 11-18; a control circuit section (LSI) 31; a temperature detecting section 32; test coils 33a-33d; and pads 34a-34h for connecting the magnetic sensor 10 with external equipment via Au wires bonded to the upper surfaces of the pads.

The GMR element 11 is called the first X-axis GMR element 11 and, as shown in FIG. 1, is formed on the substrate 10a in the vicinity of the approximate center of a left-hand side of the substrate 10a extending along the Y-axis direction. The GMR element 12 is called the second X-axis GMR element 12 and is disposed in the vicinity of the approximate center of the left-hand side of the substrate 10a in such a manner that the second X-axis GMR element 12 is located adjacent to (neighboring) the first X-axis GMR element 11 at a position spaced a short distance in the positive X-axis direction from the first X-axis GMR element 11.

The GMR element 13 is called the third X-axis GMR element 13 and is formed on the substrate 10a in the vicinity of the approximate center of a right-hand side of the substrate 10a extending along the Y-axis direction. The GMR element 14 is called the fourth X-axis GMR element 14 and is disposed in the vicinity of the approximate center of the right-hand side of the substrate 10a in such a manner that the fourth X-axis GMR element 14 is located adjacent to (neighboring) the third X-axis GMR element 13 at a position spaced a short distance in the negative X-axis direction from the third X-axis GMR element 13.

The GMR element 15 is called the first Y-axis GMR element 15 and is formed on the substrate 10a in the vicinity of the approximate center of the upper side of the substrate 10a extending along the X-axis direction. The GMR element 16 is called the second Y-axis GMR element 16 and is disposed in the vicinity of the approximate center of the upper side of the substrate 10a in such a manner that the second Y-axis GMR element 16 is located adjacent to (neighboring) the first Y-axis GMR element 15 at a position spaced a short distance in the negative Y-axis direction from the first Y-axis GMR element 15.

The GMR element 17 is called the third Y-axis GMR element 17 and is formed on the substrate 10a in the vicinity of the approximate center of the lower side of the substrate 10a extending along the X-axis direction. The GMR element 18 is called the fourth Y-axis GMR element 18 and is disposed in the vicinity of the approximate center of the lower side of the substrate 10a in such a manner that the fourth Y-axis GMR element 18 is located adjacent to (neighboring) the third Y-axis GMR element 17 at a position spaced a short distance in the positive Y-axis direction from the third Y-axis GMR element 17.

A spin valve layer constituting each of the GMR elements 11-18 includes a free layer, a conductive spacer layer, a pin layer (fixed magnetization layer), and a capping layer which are superposed (formed) one over another on the upper surface of the layer S3 on the substrate 10a. The magnetization direction of the free layer changes freely in accordance with variation in the external magnetic field. The pin layer includes a pinning layer and a pinned layer; the magnetization direction of the pinned layer is fixed by the pinning layer and does not change with respect to the external magnetic field except in a special case.

Figure 4:
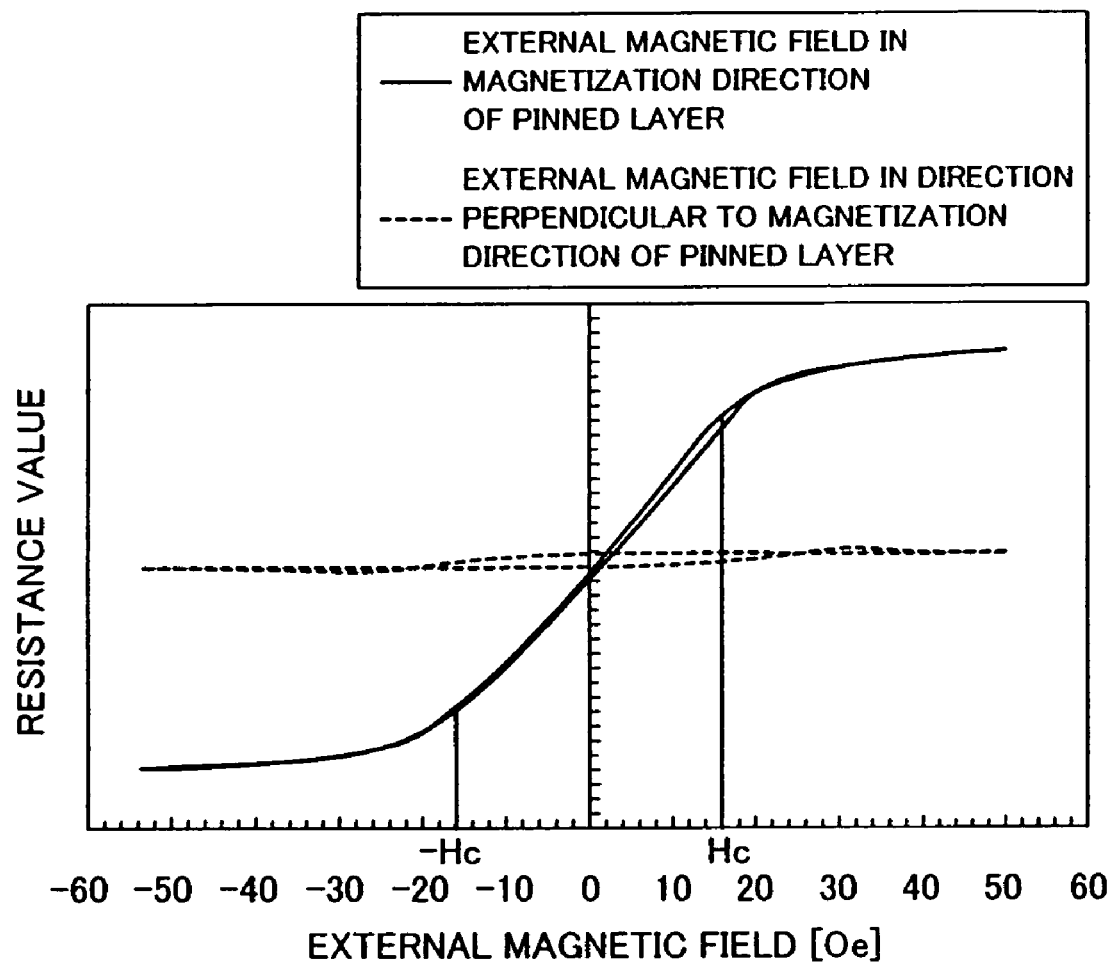
FIG. 4 is a graph showing variations in the resistance value of a GMR element of FIG. 1 with respect to an external magnetic field.

Each of the GMR elements 11-18 thereby assumes a resistance value corresponding to an angle between the pinned-layer magnetization direction and the free layer magnetization direction. Namely, each of the GMR elements 11-18, as indicated by solid lines in the graph of FIG. 4, assumes a resistance value which varies within the range of −Hc to +Hc approximately in proportion to an external magnetic field varying in the pinned-layer magnetization direction; and, as indicated by dotted lines, assumes a resistance value which is approximately constant for an external magnetic field varying in the direction perpendicular to the pinned-layer magnetization direction. In other words, each of the GMR elements 11-18 is such that the pinned-layer magnetization direction is identical with the magnetic field detecting direction.

The pinned-layer magnetization direction of each of the GMR elements 11 and 12 is the negative X direction. Namely, the first and second X-axis GMR elements 11 and 12 form one element group Gr1 in which a plurality of magnetoresistive elements which detect the magnitude of a magnetic field in the same direction (in this case the X direction); i.e., which have the same magnetic field detecting direction, are located adjacent to one another in the form of an island on the layer S3 superposed on the substrate 10a.

The pinned-layer magnetization direction of each of the GMR elements 13 and 14 is the positive X direction. Namely, the third and fourth X-axis GMR element 13 and 14 form another element group Gr2 in which a plurality of magnetoresistive elements for detecting the magnitude of a magnetic field in the same direction (in this case the X direction) are located adjacent to one another in the form of an island on the layer S3 superposed on the substrate 10a.

The pinned-layer magnetization direction of each of the GMR elements 15 and 16 is the positive Y direction. Namely, the first and second Y-axis GMR elements 15 and 16 form still another element group Gr3 in which a plurality of magnetoresistive elements for detecting the magnitude of a magnetic field in the same direction (in this case the Y direction) are located adjacent to one another in the form of an island on the layer S3 superposed on the substrate 10a.

The pinned-layer magnetization direction of each of the GMR elements 17 and 18 is the negative Y direction. Namely, the third and fourth Y-axis GMR element 17 and 18 form a further element group Gr4 in which a plurality of magnetoresistive elements for detecting the magnitude of a magnetic field in the same direction (in this case the Y direction) are located adjacent to one another in the form of an island on the layer S3 superposed on the substrate 10a.

Thus, the GMR elements 11-18 form four element groups (islands) Gr1-Gr4 in which two neighboring magnetoresistive elements of each element group are identical in terms of magnetic field detecting direction. These element groups Gr1-Gr4 are disposed outside the approximate center positions of the respective sides of a square (sides of the square bridge wiring section 19 as viewed in plan) having sides along the X and Y directions as viewed in plan, and are formed in such a way that, when an arbitrary element group is angularly moved through 90° about a centroid of the square (the center of the square; i.e., the intersection point of diagonal lines of the square), the arbitrary element group becomes substantially aligned with a position that before the angular movement through 90° had been occupied by another, neighboring element group. In other words, the plurality of GMR elements 11-18 are disposed in four spaced islands on the upper surface of the layer S3 superposed on the substrate 10a, and are formed in such a manner that, when the plurality of magnetoresistive elements 11-18 are angularly moved in a plane parallel to the upper surface of the layer S3 through 90° about the centroid GP of a quadrangle formed by four straight lines interconnecting approximate centers of adjacent pair of the islands, an arbitrary one of the islands becomes substantially aligned with a position before the angular movement through 90° had been occupied by another, neighboring island in the direction of the angular movement. Namely, assuming not only that four straight lines (line segments); i.e., a straight line interconnecting the approximately central portions of the element groups Gr2 and Gr3, a straight line interconnecting the approximately central portions of the element groups Gr3 and Gr1, a straight line interconnecting the approximately central portions of the element groups Gr1 and Gr4, and a straight line interconnecting the approximately central portions of the element groups Gr4 and Gr2, are obtained, but also that, when the element groups are angularly moved through 90° about the centroid of a quadrangle formed by these line segments, each element group becomes aligned with the position that before the angular movement had been occupied by another, neighboring element group; namely, the element group Gr2 becomes aligned with the former position of the element group Gr3, the element group Gr3 becomes aligned with the former position of the element group Gr1, and so forth.

Figure 5:
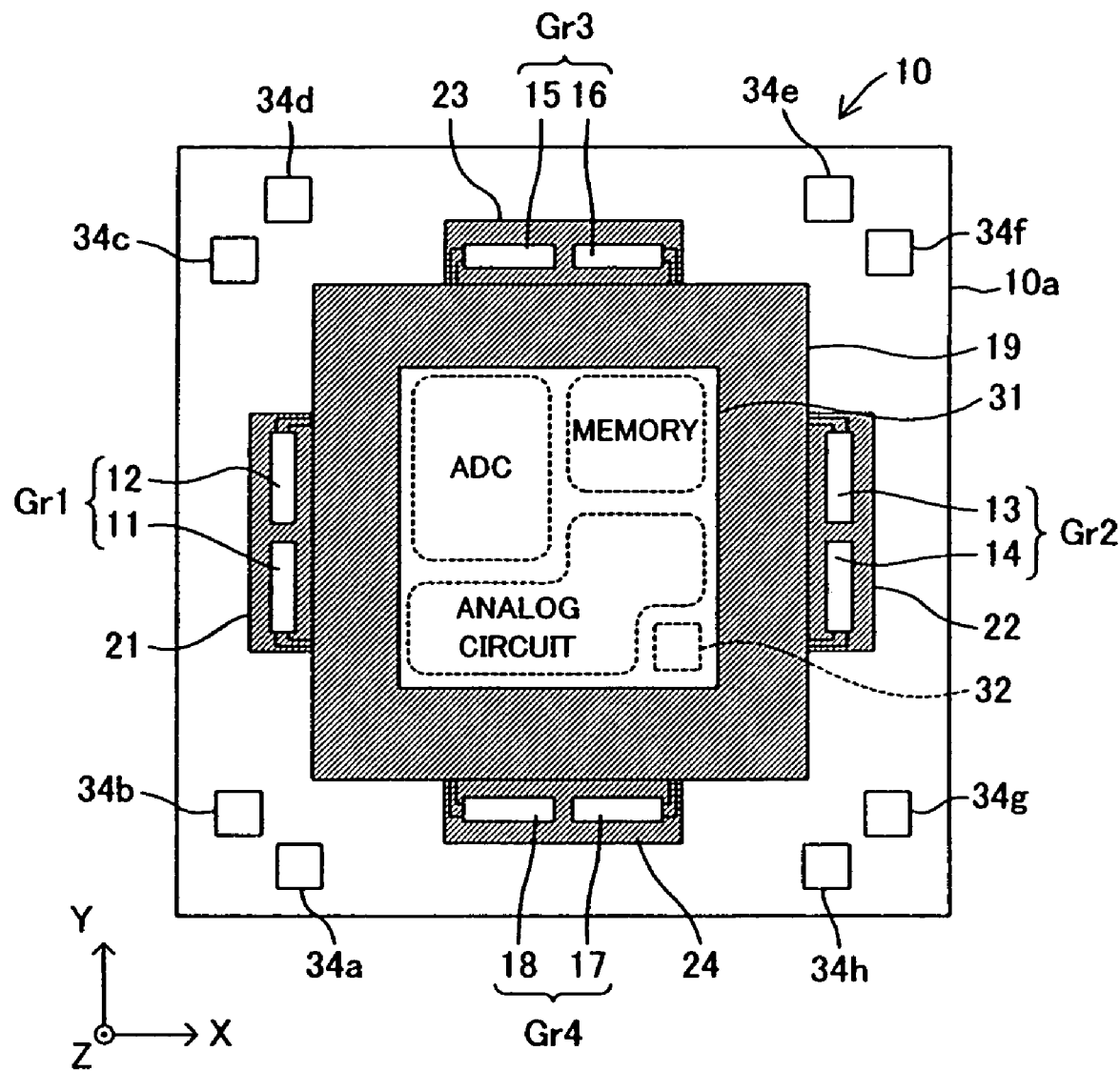
FIG. 5 is a schematic plan view of a magnetic sensor according to a modification of the first embodiment.

In the example shown in FIGS. 1 through 3, two GMR elements constituting a single island (a single element group) are located adjacent to each other in the direction from the center (centroid, which is aligned with the above-mentioned centroid GP) of the substrate 10a toward one side (periphery) of the substrate 10a. Namely, each of the plurality of element groups Gr1-Gr4 each including a pair of magnetoresistive elements of identical magnetic field detecting direction is disposed at the upper portion of the substrate 10a in such a way that the pinned-layer magnetization directions of the magnetoresistive elements become substantially parallel to the direction in which a distance from the centroid of the substrate 10a increases, as viewed in plan, and such that the above-mentioned pair of magnetoresistive elements are disposed adjacent to each other in the same direction. Alternatively, as shown in FIG. 5, a pair of magnetoresistive elements may be disposed adjacent to each other in the direction along one side of the substrate 10a. However, according to the former arrangement, because the GMR elements come closer to the centers of the respective sides of the (square) substrate 10a as compared with the latter arrangement, the characteristics of the elements can easily become uniform. Further, in the case of the former, a magnetic field having the same magnitude in the same direction can be easily applied to a pair of magnetoresistive elements as compared with the latter case.

Figure 6:
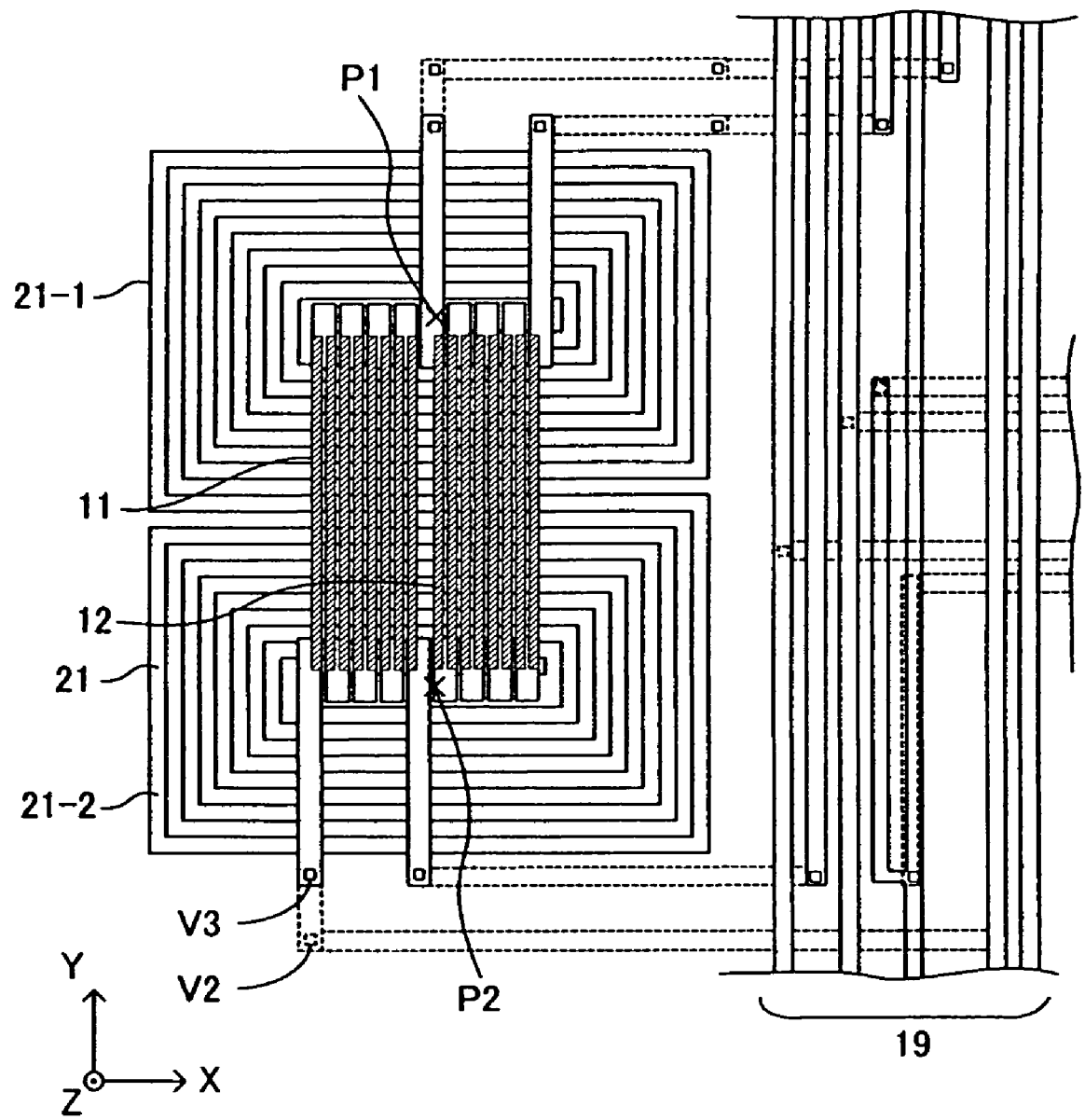
FIG. 6 is an enlarged plan view of a portion of the magnetic sensor of FIG. 1.
Figure 7:
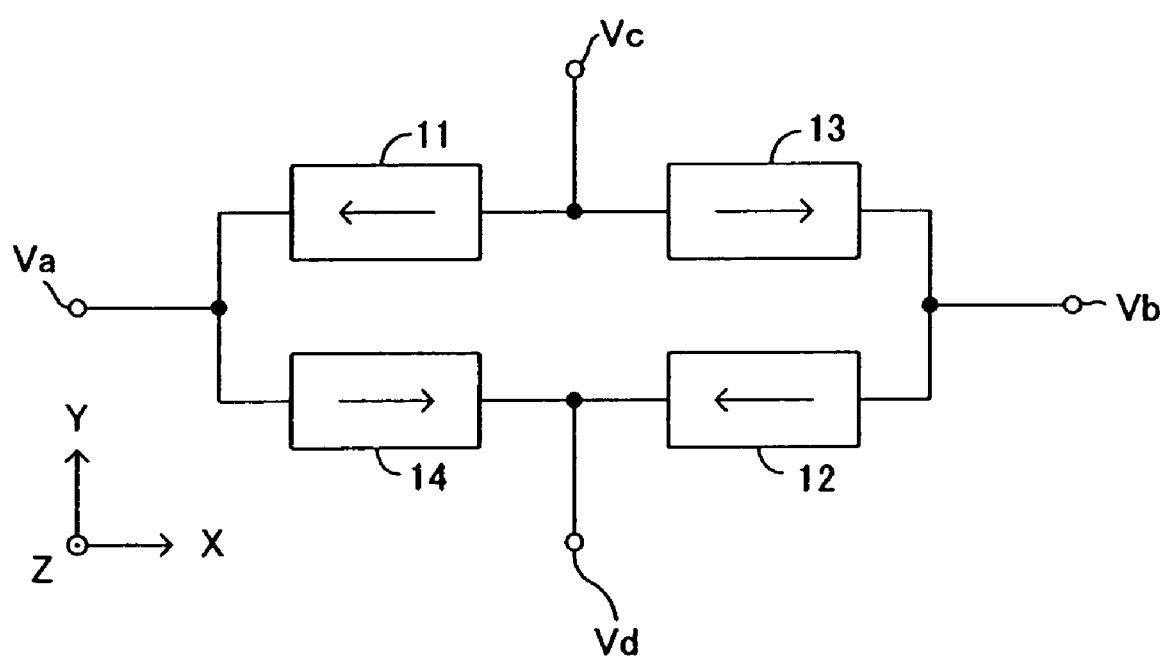
FIG. 7 is an equivalent circuit diagram of an X-axis magnetic sensor of the magnetic sensor of FIG. 1.

As exemplified in FIG. 6, which is an enlarged plan view of an area in the vicinity of the GMR elements 11 and 12, the GMR elements 11-14 are connected to the respective wires of the bridge wiring section 19, to thereby constitute a bridge circuit (full-bridge connected) through the medium of the bridge wiring section 19 as shown in an equivalent circuit diagram of FIG. 7, thereby constituting the X-axis magnetic sensor whose magnetic field detecting direction is the X direction. In FIG. 7, an arrow labeled in each GMR element 11-14 indicates the pinned-layer magnetization direction of the respective GMR element 11-14.

Figure 8:
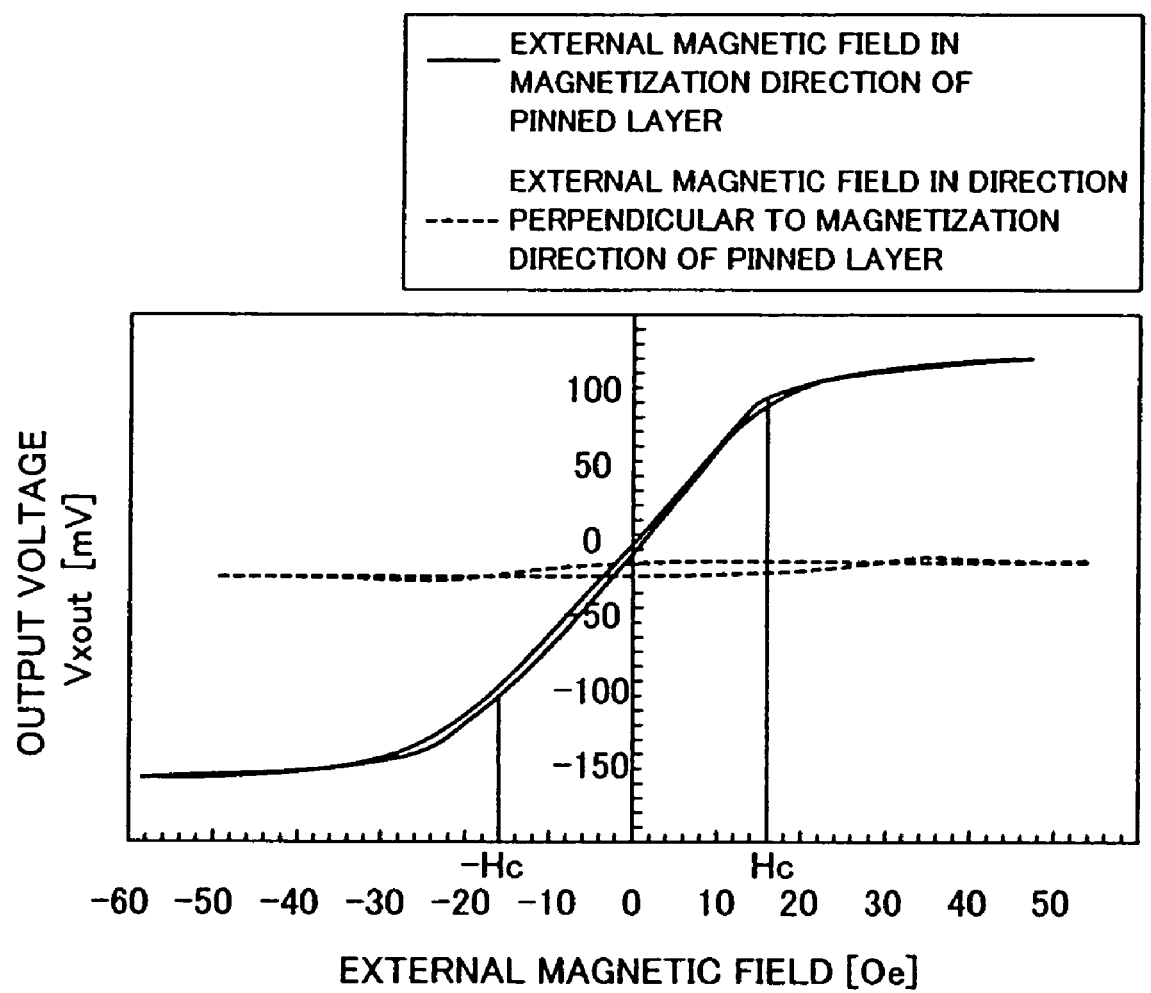
FIG. 8 is a graph showing variations in the output voltage (output signal) of the X-axis magnetic sensor constituting the magnetic sensor of FIG. 1, with respect to an external magnetic field.

More specifically, the X-axis magnetic sensor is such that, when a constant potential difference is applied between a junction Va between the first and fourth X-axis GMR elements 11 and 14 and a junction Vb between the third and second X-axis GMR elements 13 and 12, a potential difference (Vc-Vd) between a junction Vc between the first and third X-axis GMR elements 11 and 13 and a junction Vd between the second and fourth X-axis GMR elements 12 and 14 is derived as a sensor output value Vxout. As a result, the output voltage (physical quantity represented by voltage) of the X-axis magnetic sensor changes approximately in proportion to the magnitude of an external magnetic field within the range of −Hc to +Hc, which magnitude varies along the X-axis, as indicated by solid lines in FIG. 8; and remains at a constant value of approximately "0" for an external magnetic field whose magnitude varies along the Y-axis.

Similar to the case of the GMR elements 11-14, the GMR elements 15-18 are connected to the respective wires of the bridge wiring section 19 to constitute a bridge circuit (full-bridge connected), thereby constituting the Y-axis magnetic sensor whose magnetic field detecting direction is the Y-axis direction. Namely, the Y-axis magnetic sensor exhibits an output voltage (physical quantity represented by voltage) Vyout which changes approximately in proportion to the magnitude of an external magnetic field within the range of −Hc to +Hc, which magnitude varies along the Y-axis; and exhibits an output voltage of approximately "0" with respect to an external magnetic field whose magnitude varies along the X-axis.

As shown in FIG. 1, the bridge wiring section 19 is formed at the periphery of an approximate square area having sides along the X-axis and Y-axis and located inside the GMR elements 11-18, as viewed in plan, thereby constituting substantially a closed curve (including straight portions). As described in detail later, the bridge wiring section 19 is formed in the layer S3 beneath the GMR elements 11-18.

As shown in FIGS. 1 and 3, heating coils 21-24 are embedded in the layer S3, which functions as a wiring layer, to be located right beneath the element groups Gr1-Gr4 (in the negative Z direction). The heating coils 21-24 are approximately identical with each other in terms of shape and positional relation with the corresponding element groups Gr1-Gr4. Therefore, in the following description, only the heating coil 21 is described in detail.

The heating coil 21 is a heat generating element formed of, for example, aluminum thin film. When electrically energized, the heating coil 21 generates heats to thereby heat the first and second GMR elements 11 and 12 (element group Gr1). The heating coil 21 is formed in the layer S3 to face the lower surfaces of the magnetoresistive elements 11 and 12, to thereby be disposed directly below the element group Gr1. Namely, as is understood from FIG. 3, the heating coil 21 is embedded and formed in the layer S3, among the insulating layer INS1 and the layers S1-S3 superposed one over another on the substrate 10a, on which layer the GMR elements 11-18 are formed (the uppermost layer S3 among the layers S1-S3 each functioning as a wiring layer). In the present description, a layer functioning as a wiring layer refers to wires, an interlayer insulating layer between wires, and contact holes (including via-holes) for establishing connection between wires.

Further, as shown in FIG. 6, the heating coil 21 is a so-called double-spiral coil which is approximately rectangular in shape as viewed in plan and which includes a pair of coiled conductors (i.e., a first conductor 21-1 having a coil center P1 and a second conductor 21-2 having a coil center P2); the Y-direction length of the rectangular shape is approximately two times the longitudinal length of the magnetoresistive element 11 (12), and the X-direction length of the rectangular shape is approximately five times the transverse (direction perpendicular to the longitudinal direction) length of the magnetoresistive element 11 (12).

In addition, the first and second X-axis GMR elements 11 and 12 are located between the two coil centers P1 and P2 as viewed in plan. Further, portions of the first and second conductors 21-1 and 21-2 which overlap the first and second X-axis GMR elements 11 and 12 (i.e., portions extending directly under the first and second X-axis GMR elements 11 and 12) as viewed in plan, extend linearly in parallel to each other in the X direction. These straight portions of each conductor are adapted to carry a current of the same flow direction and to thereby generate a magnetic field in the Y-axis direction. Namely, the heating coil 21 is adapted to generate a magnetic field in a direction that coincides with the longitudinal direction of the first and second X-axis GMR elements 11 and 12, and in the designed direction (direction perpendicular to the fixed direction of magnetization of the pinned layer) of magnetization of the free layer in the absence of application of any external magnetic field.

As described above, the magnetic sensor 10 according to the first embodiment is a magnetic sensor including the GMR elements (magnetoresistive elements each including a free layer and a pin layer), and equipped with the heating coils 21-24 which are disposed under (and adjacent to) the free layer and adapted to stabilize (initialize) the direction of magnetization of the free layer in the absence of application of any external magnetic field and which, when electrically energized under a predetermined condition (e.g., before the start of detection of magnetism), generates in the free layer a magnetic field (an initializing magnetic field) having a predetermined direction (perpendicular to the pinned-layer magnetization direction). Further, the heating coils 24 are configured in such a manner that when electrically energized in a predetermined pattern under a predetermined condition, each of the heating coils 21-24 heats the GMR elements (GMR element group) located directly above.

As shown in FIG. 1, the control circuit section 31 is formed in an approximate square having sides along the X- and Y-axes to be located inward of the bridge wiring section 19 as viewed in plan (inward of a substantial closed curve outlined by the wiring section 19 or in a center portion of the substrate 10a as viewed in plan). As shown in FIG. 3, the control circuit section 31 is formed in the layers INS1, S1-S3 beneath the GMR elements 11-18. The control circuit section 31 assumes the form of an LSI including an analog-to-digital converter (ADC), a WORM (write once, read many) memory (hereinafter also called "the first memory" for the sake of convenience) capable of writing data once and reading the data many times, and an analog circuit section. The control circuit section 31 provides various functions such as generation of output signals through obtainment of output values of the X-axis magnetic sensor and Y-axis magnetic sensor (physical quantities detected in the form of voltage on the basis of resistance values) and processing, such as analog-to-digital conversion, of the output values; electrical energization of the heating coils 21-24; obtainment of a detection temperature output from the temperature detecting section 32; obtainment of temperature compensating data; and storage (writing) of the data into the first memory.

Because the control circuit section 31 is thus located in the central portion of the substrate 10a, the length of wire of the control circuit section 31 can be shortened. Accordingly, the circuit resistance and the circuit size itself are reduced, so that the circuit is hardly affected by noise, and variation in resistance in the circuit (variation among individual products) decreases.

As the WORM memory, a fuse-break-type 24-bit memory can be used. Alternatively, a memory (nonvolatile memory), such as an EEPROM or a flash memory, may be used so that data can be written thereinto and retained therein even during shutoff of electric power supply.

The temperature detecting section 32 assumes the form of a conventional bandgap reference circuit which detects temperature on the basis of the temperature characteristic of a built-in transistor; and is formed at a corner of the control circuit section 31 inside the bridge wiring section 19 as viewed in plan. The temperature detecting section 32 is located in the wiring layer S1 at a position adjacent to the GMR elements 17 and 18 (element group Gr4) rather than to the GMR elements 11-16 and is adapted to output a temperature (detection temperature) that always has a constant correlation with the temperature of the GMR element

18 (element group Gr4). As will described later, because the magnetoresistive elements 11-18 are heated to the same temperature, the temperature of the other magnetoresistive elements 11-17 can be determined by detecting a temperature of only the magnetoresistive element 18.

Given that the temperature detecting section 32 is thus located inside the bridge wiring section 19 at a position adjacent to the element group Gr4, the temperature detecting section 32 can detect a temperature of the GMR element 18 with precision. Moreover, because the temperature detecting section 32 is connected to the control circuit section 31 without crossing the bridge wiring section 19, the length of wire between the temperature detecting section 32 and the control circuit section 31 can be shortened.

The test coils 33a-33d are formed in the wiring layer S1 and are located directly beneath the respective element groups Gr1-Gr4; FIG. 3 shows the test coil 33a as an example. When electrically energized, each of the test coils 33a-33d applies, to one of the magnetoresistive elements disposed directly above, a magnetic field in the magnetic field detecting direction of the respective magnetoresistive element (magnetic field in the pinned-layer magnetization direction).

The magnetic sensor 10 will now be described in terms of layer structure. As shown in FIG. 3, the upper part of the substrate 10a is divided into an element isolation region 10a1, and the remaining region serves as an element activation region 10a2. The element isolation region 10a1 is formed on the upper surface of the substrate 10a as a field insulating layer INS (e.g., field oxide) by the LOCOS or STI technique. The LOCOS technique is a well known technique which insulates and separate various elements from one another by means of a thermally oxidized layer. The STI technique is a well known technique called shallow-trench element separation and is adapted to separate various elements by embedding an oxidized layer in a shallow trench.

Directly above the substrate 10a and on the upper surface of the insulating layer INS, an insulating layer INS1 is formed. Within the element activation region 10a2 in the insulating layer INS1, various circuit elements such as transistors Tr are formed. Within the element isolation region 10a1 in the insulating layer INS1, various elements such as resistors R, fuses, and capacitors are formed. Further, within the insulating layer INS1, a plurality of contact holes C1 (connecting portions, vertical connecting portions) electrically connecting circuit elements, such as the transistors Tr, with wires etc. formed in the layer S1 disposed over the insulating layer INS1, are formed perpendicular to the surfaces of the layers S1-S3 (so as to cross the surfaces of the layers S1-S3). The contact holes C1 are filled with an electrically conductive substance.

Over the insulating layer INS1, the layer S1 functioning as the wiring layer is formed. The layer S1 includes wires W1 in the form of a conductive layer, the test coils 33a-33d, an interlayer insulating layer IL1, and the temperature detecting section 32. In the interlayer insulating layer IL1, a plurality of via-holes V1 (connecting portions, vertical connecting portions) for electrical connection with the wires etc. formed in the upper layer S2 are formed perpendicular to the surfaces of the layers S1-S3 (so as to cross the surfaces of the layers S1-S3). The via-holes V1 are filled with an electrically conductive substance.

Likewise, over the layer S1, the layer S2 functioning as a wiring layer is formed. The layer S2 includes wires W2 in the form of an electrically conductive layer, and the interlayer insulating layer IL2. In the interlayer insulating layer IL2, a plurality of via-holes V2 (connecting portions, vertical connecting portions) for electrical connection with the wires etc. formed in the upper layer S3 are formed perpendicular to the surfaces of the layers S1-S3 (so as to cross the surfaces of the layers S1-S3). The via-holes V2 are filled with an electrically conductive substance.

Also likewise, over the layer S2, the layer S3 functioning as a wiring layer is formed. The layer S3 includes wires W3 in the form of an electrically conductive layer, the bridge wiring section 19, the heating coils 21 (22-24), and the interlayer insulating layer IL3. In the interlayer insulating layer IL3, a plurality of via-holes V3 (connecting portions, vertical connecting portions) for electrical connection with the GMR elements 11-18 formed on the upper surface of the layer S3 are formed perpendicular to the surfaces of the layers S1-S3 (so as to cross the surfaces of the layers S1-S3). The via-holes V3 are filled with an electrically conductive substance. The interlayer insulating layer IL3 may be a passivation layer which includes nitride film and which differs from a passivation layer PL to be described later. In order to maintain the characteristics of the GMR elements 11-18 at an excellent level, the upper surface of the interlayer insulating layer IL3 is preferably smoothed. Further, the contact holes C1 and the via-holes V1-V3 are connecting portions of a conductive substance interconnecting the GMR elements 11-18, the bridge wiring section 19 serving as a wiring section, the control circuit section 31, etc., and extending in the plurality of layers INS1, S1-S3 in directions intersecting the surfaces thereof.

A pad region PD is a region other than the portion in which the GMR elements 11-18 is formed, the bridge wiring section 19, and the control circuit section 31; and is located at a corner of the magnetic sensor 10 as viewed in plan (see FIG. 1). The upper surface of the pad region PD constitutes the above-described pads 34a-34h. The pads 34a-34h may be formed only on the uppermost layer S3; but in such a case, the pads 34a-34h shall bear impact during the bonding of Au wires. Consequently, in the present embodiment, pad sections of approximate square shape as viewed in plan are formed across the plurality of layers S1-S3.

The passivation layer PL is formed so as to cover the upper surfaces of the layer S3 and those of the GMR elements 11-18. In forming the passivation layer PL, first a prospective passivation layer is formed so as to cover all of the elements, and then layer portions corresponding to the pads 34a-34h are removed. The pads 34a-34h are thereby exposed for bonding of the Au wires.

Figure 9:
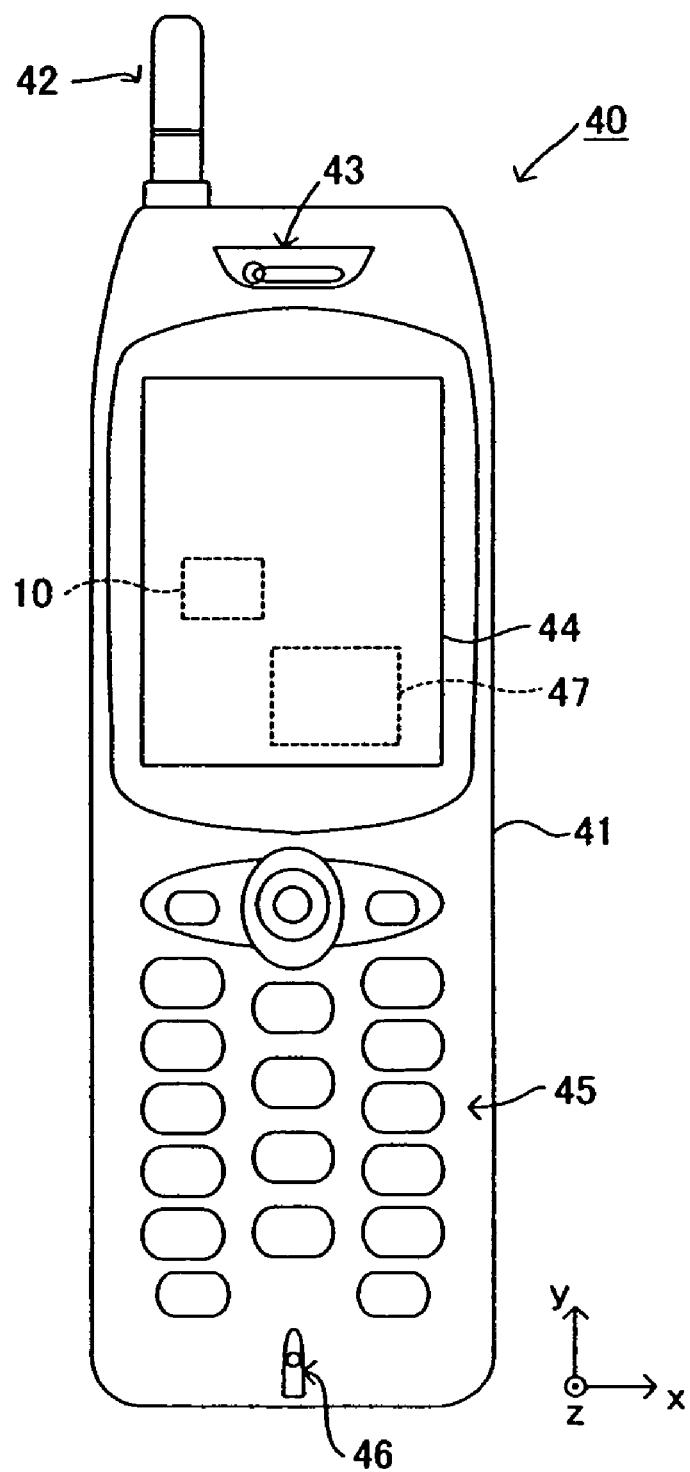
FIG. 9 is a front view of a cellular phone on which the magnetic sensor of FIG. 1 is to be mounted.

The magnetic sensor 10 is accommodated and mounted in a cellular phone 40, which is an example of mobile electronic equipment and whose face is depicted in the schematic front view of FIG. 9. The cellular phone 40 includes a casing (body) 41 which has an approximately rectangular shape having sides along perpendicularly intersecting x- and y-axes as viewed in front elevation and whose depth is along the z-axis perpendicular to the x- and y-axes; an antenna 42 located at an upper side surface of the casing 41; a speaker 43 located at an uppermost portion of a front side of the casing 41; a liquid crystal display 44 located at the front side of the casing 41 downward of the speaker 43 and adapted to display characters and graphics; an operation section (operating signal input means) 45 located at the front side of the casing 41 downward of the liquid crystal display 44 and having switches which are used to input a telephone number or other instruction signals; a microphone 46 located at a lowermost portion of the front side of the casing 41; and a microcomputer 47 which is configured so as to be able to communicate with the magnetic sensor 10, the display 44, etc. via a bus and which comprises a RAM and a backup memory (which may be in the form of an EEPROM, is a memory retaining data even during a shutoff of main power supply, and is called, for the sake of convenience, "the second memory").

Some or all of the antenna 42, the speaker 43, the liquid crystal display 44, the operation section 45, and the microphone 46 include permanent magnet components (leakage magnetic field generating elements) as components. The magnetic sensor 10 is accommodated in and fixed to the casing 41 in such a way that the X-, Y-, and Z-axes of the magnetic sensor are aligned with the x-, y-, and z-axes of the casing, respectively.

The manner of compensating the temperature-dependent characteristic of the thus-configured magnetic sensor 10 will now be described. Generally, a magnetoresistive element such as a GMR element has a temperature-dependent characteristic such that, for example, the resistance increases with increasing temperature due to the material characteristic of the element; this temperature-dependent characteristic is peculiar to an individual element. Accordingly, the above-described magnetic sensor 10 (each of the X-axis magnetic sensor and Y-axis magnetic sensor), comprising a full-bridge circuit of four GMR elements, also has a temperature-dependent characteristic such that the output of the magnetic sensor changes with variation in temperature. The temperature-dependent characteristics of the individual GMR elements constituting the magnetic sensor 10 are classified into two different types; i.e., a type in which the output of the magnetic sensor 10 increases with increasing temperature of the GMR element, and another type in which the output of the magnetic sensor 10 decreases with increasing temperature of the GMR element.

Figure 10:
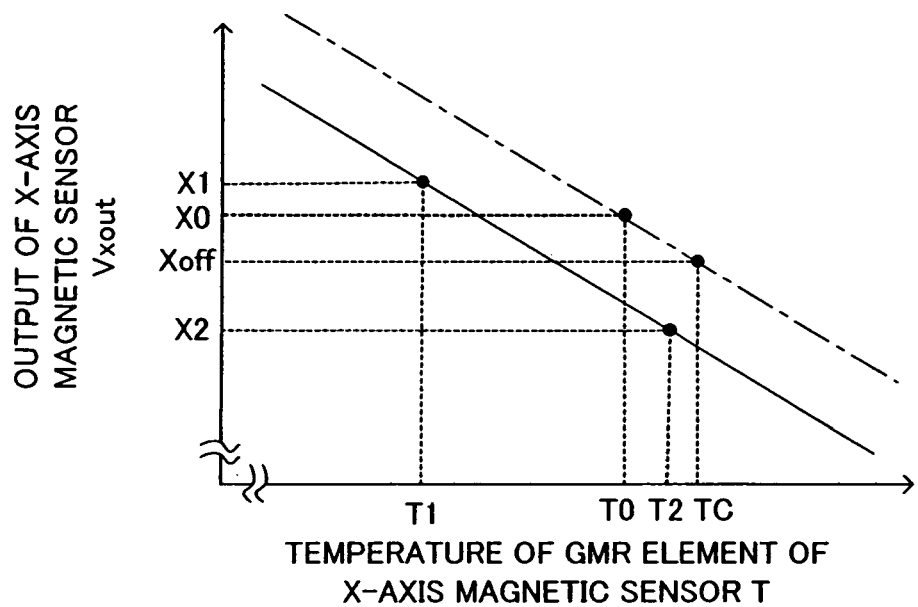
FIG. 10 is a graph showing a temperature-dependent characteristic of the X-axis magnetic sensor constituting the magnetic sensor of FIG. 1.
Figure 11:
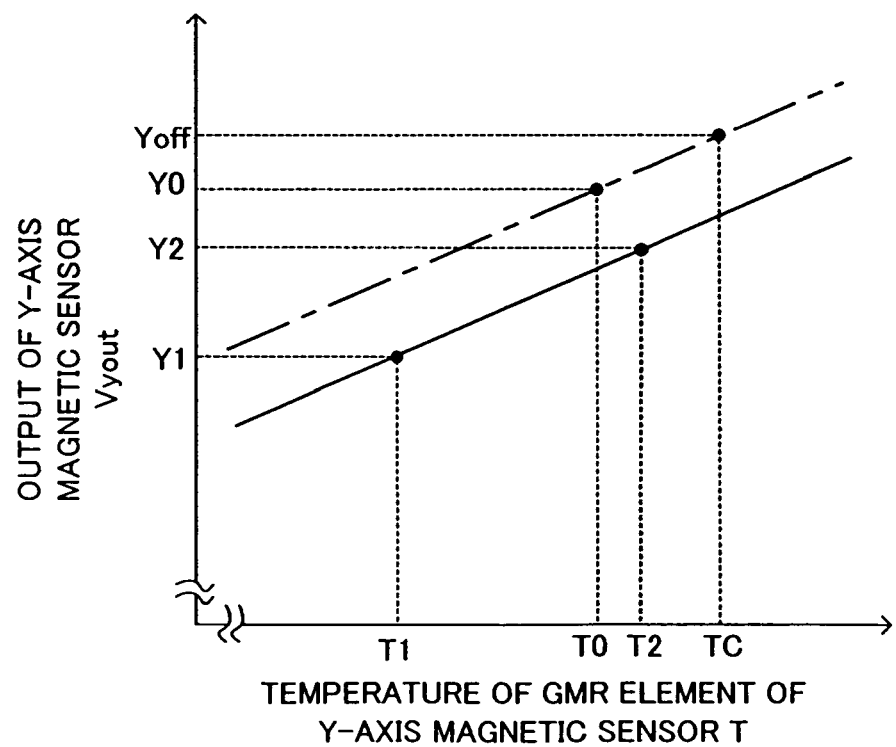
FIG. 11 is a graph showing a temperature-dependent characteristic of a Y-axis magnetic sensor which constitutes a portion of the magnetic sensor of FIG. 1.

FIGS. 10 and 11 are graphs respectively showing the above-mentioned exemplary temperature-dependent characteristics of the magnetic sensor. In the example shown here, the X-axis magnetic sensor has a negative temperature-dependent characteristic; and the Y-axis magnetic sensor has a positive temperature-dependent characteristic. In these graphs, solid lines represent output values Vxout and Vyout of the respective magnetic sensors when X and Y components of an external magnetic field (e.g., the geomagnetism in a predetermined site at a predetermined time) are HX0 and HY0, respectively; and dash-and-single-dot lines represent output values Vxout and Vyout of the respective magnetic sensors when an external magnetic field (e.g., a leakage magnetic field from the permanent magnet components of the cellular phone 40) in the absence of any influence of geomagnetism are HX1 and HY1, respectively.

As is understood from FIGS. 10 and 11, the output values Vxout and Vyout of the magnetic sensor 10 change in approximate proportion to the temperature of the GMR element with respect to the same magnetic field. Consequently, in the present embodiment, the temperature-dependent characteristic is compensated on the assumption that the output values Vxout and Vyout of the respective magnetic sensor change in proportion to the temperature of the GMR element.

First, when a predetermined condition to obtain data for compensation of temperature-dependent characteristic is established in response to, for example, input of an instruction signal from the outside, the control circuit section 31 obtains, as a first temperature T1$s$, a detection temperature output from the temperature detecting section 32, which temperature corresponds to a current temperature T1 of the GMR element 18. At that time, since the entirety of the magnetic sensor 10 is of uniform temperature (room temperature), the detection temperature T1$s$ output from the temperature detecting section 32 is equal to the temperature T1 of the GMR element 18. Simultaneously, the control circuit section 31 obtains a current output value X1 of the X-axis magnetic sensor (first output value X1 of the X-axis magnetic sensor) and a current output value Y1 of the Y-axis magnetic sensor (first output value Y1 of the Y-axis magnetic sensor). Then, the control circuit section 31 supplies a 100 mA current to the heating coils 21-24 in sequence for 100 ms each. The element groups Gr1-Gr4 are thereby heated to approximately the same temperature.

Figure 12:
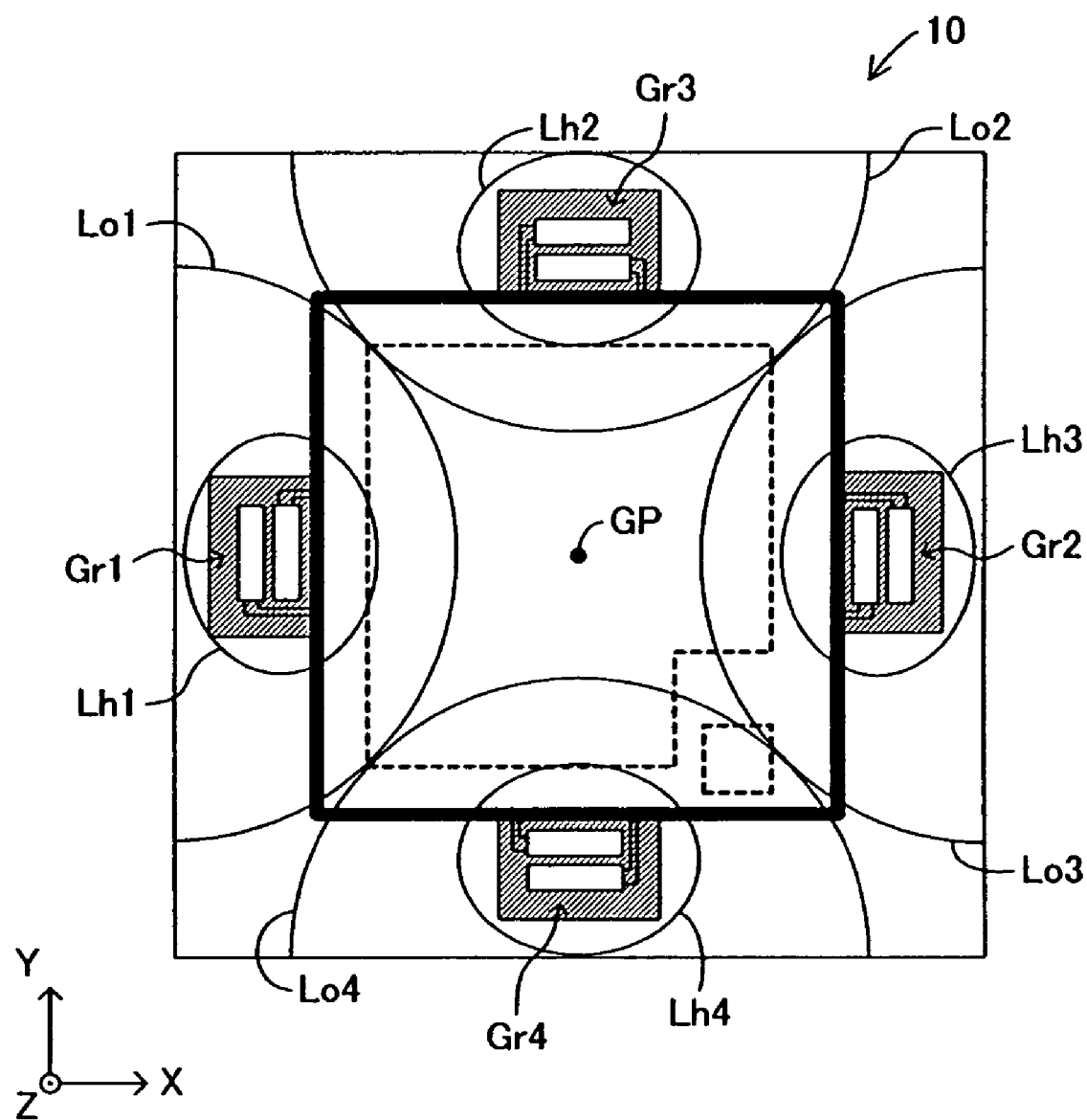
FIG. 12 is a schematic plan view of the magnetic sensor of FIG. 1, showing isothermal lines when heating coils of the magnetic sensor are energized.

FIG. 12 is a diagram showing isothermal lines on the surface of the magnetic sensor on which the element groups Gr1-Gr4 are formed, by curves Lh1-Lh4 and Lo1-Lo4. The temperatures Temp at points on each isothermal line represented by the corresponding curve Lh1-Lh4 are approximately the same. The temperatures at points on each isothermal line represented by the corresponding curve Lo1-Lo4 are equal to one another but lower than the above-mentioned temperature Temp. Thus, because the heating coils 21-24, when electrically energized, heat mainly the corresponding element groups Gr1-Gr4 (disposed directly above the respective heating coils) but do not heat the entirety of the magnetic sensor 10 (microchip) uniformly, the upper surface of the layer S3 on which the element groups Gr1-Gr4 are formed are nonuniform in temperature, and such irregular temperatures of the entire upper surface of the layer S3 are lower than the temperature of the element groups Gr1-Gr4.

In this state, the control circuit section 31 first obtains a current detection temperature output from the temperature detecting section 32 as a temperature T2$s$, and then calculates a second temperature T2 of the GMR element 18 according to a constant correlation between the temperature output from the temperature detecting section 32 and the temperature of the GMR element 18, which correlation is expressed by the formula T2=T1$s$+k·(T2$s$−T1$s$) (k is a constant predetermined by experiments). Additionally, the control circuit section 31 obtains a current output value of the X-axis magnetic sensor (second output value X2 of the X-axis magnetic sensor) and a current output value Y2 of the Y-axis magnetic sensor (second output value Y2 of the Y-axis magnetic sensor).

Further, the control circuit section 31 calculates gradients Mx and My (quantities of change of output per unit temperature change), which are determined by the following formulae (1) and (2), as basic data for compensation of temperature-dependent characteristic, and writes the gradients Mx and My into the above-described first memory (this function corresponding to the function of the temperature-dependent characteristic writing means). The gradient Mx is a "ratio" of the difference between the first and second output values X1 and X2 of the X-axis magnetic sensor to the difference between the first and second temperatures T1 and T2; and the gradient My is a "ratio" of the difference between the first and second output values Y1 and Y2 of the Y-axis magnetic sensor to the difference between the first and second temperatures T1 and T2.

$$Mx=(X2-X1)/(T2-T1) \quad (1)$$

$$My=(Y2-Y1)/(T2-T1) \quad (2)$$

Figure 13:
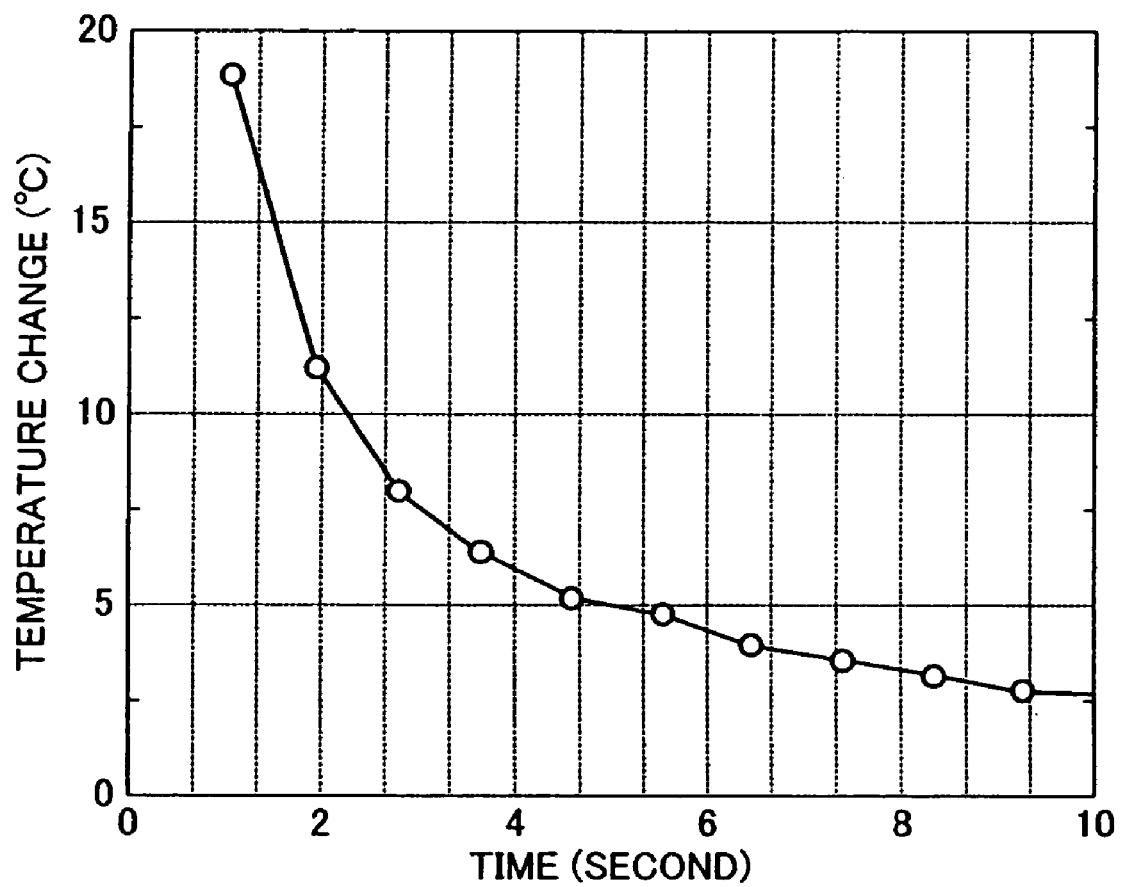
FIG. 13 is a graph showing a relation between the lapse of time from electrical energization of the heating coils of the magnetic sensor of FIG. 1 and the variation in temperature of the GMR element.

By the foregoing procedure, acquisition of the basic data for compensation of temperature-dependent characteristic is completed in a stage in which the magnetic sensor has not yet been mounted in the cellular phone. Subsequently, the magnetic sensor 10 is allowed to stand until the magnetic sensor 10 is cooled to a sufficient degree, whereupon the manufacturing process proceeds to the next step. FIG. 13 is a graph showing a relation between the lapse of time from termination of electrical energization of the heating coils 21-24 to obtain the above-described basic data for compensation of temperature-dependent characteristic, and the variation in temperature of the GMR elements 11-18.

If the GMR elements 11-18 are caused to experience an analogous temperature change by use of a conventional heating/cooling unit, the entirety of the magnetic sensor 10 is heated/cooled, which requires an elongated heating period of time. Further, after the termination of heating, the temperature of the GMR elements 11-18 falls at only a low rate, so that the required cooling of the GMR elements occasionally takes several to 20 minutes. In contrast, in the present embodiment, because the element groups Gr1-Gr4 (GMR elements 11-18) are mainly heated, the period of time required for heating the GMR elements 11-18 can be shortened. Moreover, because the temperature of the GMR elements 11-18 falls at an increased rate (higher rate) after the termination of heating, the required cooling is completed in about several seconds, as shown in FIG. 13. Therefore, the basic data for compensation of temperature-dependent characteristic can be obtained within a short period of time, and the manufacturing process can proceed to the next step within a short period of time after the above-described basic data is obtained.

Subsequently, upon completion of the steps necessary for manufacturing the magnetic sensor 10, the magnetic sensor 10 is mounted (accommodated) in the casing 41 of the cellular phone 40 equipped with a permanent magnet component such as the speaker 43, and is used as a geomagnetism sensor. As a result, a leakage magnetic field of a constant direction is continually applied from the permanent magnet component to the magnetic sensor 10 of the cellular phone 40 (irrespective of the direction of the cellular phone 40) and, therefore, the output of the magnetic sensor 10 suffers an offset (shift from zero in the case of no geomagnetism) due to the leakage magnetic field. Further, since the X-axis magnetic sensor and the Y-axis magnetic sensor are in the form of a full-bridge circuit, the output of either magnetic sensor also contains an offset as a result of the variation in resistance values (although, the values are designed to be identical each other) of the magnetoresistive elements constituting the magnetic sensor.

At that time, the output value of the X-axis magnetic sensor of the magnetic sensor 10 changes in proportion to the temperature T of the GMR elements 11-14 constituting the X-axis magnetic sensor, as indicated by the dash-and-single-dot line in FIG. 10. In this case, the slope (gradient) of the dash-and-single-dot straight line of FIG. 10 is identical with the slope of the solid straight line of FIG. 10. Likewise, the output value of the Y-axis magnetic sensor of the magnetic sensor 10 changes in proportion to the temperature T of the GMR elements 15-18 constituting the Y-axis magnetic sensor as indicated by the dash-and-single-dot straight line of FIG. 10. In this case as well, the slope of the dash-and-single-dot straight line is identical with the slope of the solid straight line of FIG. 11.

When a predetermined condition (offset obtaining condition) is established in response to, for example, operation of the operation section 45 of the cellular phone 40 by the user, the microcomputer 47 of the cellular phone 40 obtains data (offset values) of the offset of the magnetic sensor 10 (X-axis magnetic sensor, Y-axis magnetic sensor) due to the leakage magnetic field and the variations in resistance values of the magnetoresistive elements 11-18. In a more specific example, the microcomputer 47 displays on the liquid crystal display 44 a message which prompts the user first to place the cellular phone 40 on the top of a desk with its front side facing upward (i.e., with the front side of the cellular phone 40 assuming an approximately horizontal posture and the display 44 facing vertically upward) and then to push down an offset button, which is a specific button, of the operation section 45 until the offset button assumes an "ON" state.

When the user performs the above-mentioned operation, the microcomputer 47 obtains the respective output values of the X- and Y-axis magnetic sensors as X-axis first reference data Sx1 and Y-axis first reference data Sy1, and stores/memorizes these data into a temporary memory (e.g., RAM) associated with the microcomputer 47.

Then, the microcomputer 47 displays on the display 44 a message which prompts the user to rotate the cellular phone 40 through 1800 on the top of the desk (i.e., in a horizontal plane) with its front side facing upward and to push the offset button again. When the user performs this operation, the microcomputer 47 obtains the respective output values of the X- and Y-axis magnetic sensors as X-axis second reference data Sx2 and Y-axis second reference data Sy2 and stores/memorizes these data into the temporary memory.

Also, the microcomputer 47 stores/memorizes a mean value between the X-axis first reference data Sx1 and the X-axis second reference data Sx2 into the second memory as X-axis offset reference data X0; stores/memorizes a mean value between the Y-axis first reference data Sy1 and the Y-axis second reference data Sy2 into the second memory as Y-axis offset reference data Y0; and stores/memorizes a current detection temperature T0s of the temperature detecting section 32 into the second memory as a GMR element temperature T0. The reason for recording the mean value between the outputs of each magnetic sensor before and after the turning of the cellular phone 40 through 180° as the offset reference data X0 and Y0 is to obtain offset values while removing the influence of geomagnetism. Because the magnetic sensor 10 is uniform in temperature (room temperature) when the detection temperature T0 is obtained, the detection temperature T0s is equal to the GMR element temperature T0.

After that, the cellular phone 40 returns to the usual operation mode for use thereof, and measures geomagnetism by the magnetic sensor 10 when necessary. At that time, the microcomputer 47 obtains an actual detection temperature TCs of the temperature detection section 32 as the GMR element temperature TC to thereby estimate a current offset Xoff of the X-axis magnetic sensor and a current offset Yoff of the Y-axis magnetic sensor according to the following formulae (3) and (4), respectively. Because the magnetic sensor 10 is uniform in temperature (room temperature) when the detection temperature TCs is obtained, the detection temperature TCs is equal to the GMR element temperature TC.

$$Xoff = Mx \cdot (TC - T0) + X0 \quad (3)$$

$$Yoff = My \cdot (TC - T0) + Y0 \quad (4)$$

Then, the microcomputer 47 obtains a current output value XC of the X-axis magnetic sensor and a current output value YC of the Y-axis magnetic sensor to thereby calculate a magnitude Sx of a magnetic field in the X-axis direction and a magnitude Sy of a magnetic field in the Y-axis direction by the following formulae (5) and (6), respectively. Upon completion of the compensation of the temperature-dependent characteristic of the magnetic sensor 10 carried out in the foregoing manner, the magnetic sensor 10 functions as a geomagnetism sensor.

$$Sx=XC-Xoff \quad (5)$$

$$Sy=YC-Yoff \quad (6)$$

As described herein above, according to the magnetic sensor 10 of the first embodiment, because mainly the GMR elements 11-18 formed directly above the respective heating coils 21-24 are heated by the heating coils 21-24 (i.e., a portion of the magnetic sensor 10 including the substrate is heated to a lower temperature than the temperature of the magnetoresistive elements 11-18 that are heated to the same temperature), the basic data for compensation of temperature-dependent characteristic can be obtained within a short time as compared with the case in which the whole magnetic sensor 10 is heated by a heating device. Therefore, geomagnetism is very unlikely to vary during the measurement for obtaining the basic data for compensation of temperature-dependent characteristic; and hence such data can be obtained accurately. Accordingly, the temperature-dependent characteristic of the magnetic sensor 10 can be compensated with precision. Further, since the magnetic sensor 10 can be cooled within a short time as compared with the case where the magnetic sensor is cooled after having been heated by a heating device, the period of time needed for manufacturing the magnetic sensor 10 can be shortened, thereby lowering manufacturing cost.

Generally, in a magnetic sensor using magnetoresistive element such as GMR elements, when a strong external magnetic field acts on the magnetic sensor, the direction of magnetization of the free layer of the magnetoresistive elements may fail to be restored to its initial state. Consequently, the magnetic sensor is preferably configured in such a manner that initialization coils are disposed directly beneath the magnetoresistive elements, and that when the initialization coils are electrically energized as a result of establishment of a predetermined condition (e.g., operation of the specific switch of the operation section 45), the initialization coils generate a magnetic field to restore the direction of magnetization of the free layer to its initial state.

In this case, in the magnetic sensor, the above-mentioned initialization coils may be provided independently of the above-mentioned heating coils 21-24. For example, the initialization coils may be formed in a layer (the layer S1 or layer S2 in the present embodiment) other than the layer (layer S3 in the present embodiment) in which the heating coils 21-24 are formed. If the initialization coils and the heating coils are thus provided independently of each other, then the individual heating coils can be designed in a desired shape (a shape suitable for heating). For example, the heating coil may be in the form of a turnover heater (heat generating element) whose one end is located off the coil center. Further, instead of the heating coil, a sheet-like heater (heat generating member) may be used.

Alternatively, the heating coils 21-24, as mentioned above, may serve also as initialization coils. In this case, provision of dedicated initialization coils is unnecessary, thereby lowering the manufacturing cost of the magnetic sensor 10. Further, when the heating coils 21-24 are electrically energized once, heating and initializing of the elements 11-18 can be carried out simultaneously in order to obtain the basic data for compensation of temperature characteristic, thereby simplifying the manufacturing process and lowering manufacturing cost.

Further, as described above, the magnetic sensor using magnetoresistive elements such as the GMR elements 11-18 may be used also as a geomagnetism sensor that calculates the direction by arithmetically processing the output values of the magnetoresistive elements, which values change with variation in magnitude of an external magnetic field. In this case, at the stage of shipping, etc., a test must be performed to check whether the magnetoresistive elements correctly function in an external magnetic field.

In this test, a known external magnetic field must be applied to the magnetoresistive elements. In order to apply such known external-magnetic-field to the magnetoresistive elements, generating external-magnetic-field equipment is required. However, such equipment is expensive. Consequently, as an alternative, the magnetic sensor may be configured in such a manner that test coils are disposed adjacent to (e.g., directly beneath) the magnetoresistive elements, and that when electrically energized, the test coils apply to the magnetoresistive elements an external magnetic field for the test.

In this case, in the magnetic sensor 10, the above-mentioned test coils may be provided independently of the above-mentioned heating coils 21-24. For example, the test coils may be formed in a layer (the layer S1 or layer S2 in the present embodiment) other than the layer (layer S3 in the present embodiment) in which the heating coils 21-24 are formed. If the test coils and the heating coils are thus provided independently of each other, the individual heating coil can be designed in a desired shape (a shape suitable for heating). For example, the heating coil may be in the form of a turnover heater (heat generating element) whose one end is located off the coil center. Further, in place of the heating coil, a sheet-like heater (heat generating member) may be used.

Alternatively, the heating coils 21-24 may be mounted at a position angularly moved through 90° as viewed in plan so that the heating coils 21-24 can serve also as the above-mentioned test coils. In this case, coils dedicated to testing become unnecessary, thereby lowering the cost of the magnetic sensor 10.

Further, in the above-mentioned magnetic sensor 10, each heating coil 21 (22-24) includes a first wire 21-1 forming a spiral as viewed in plan, and a second wire 21-2 forming a spiral as viewed in plan; the element groups Gr1-Gr4 are located between the spiral center P1 of the first wire and the spiral center P2 of the second wire as viewed in plan; and the first and second wires are interconnected in such a way that that current flows in approximately the same direction in both a portion of the first wire which overlaps an arbitrary element group as viewed in plan, and a portion of the second wire which overlaps the arbitrary element group as viewed in plan.

As a result, a strong magnetic field (e.g., a magnetic field sufficiently strong for initialization) can applied to the magnetoresistive elements 11-18 while the areas of the heating coils 21-24 serving also as the initialization coils (or test coils) are minimized as viewed in plan, whereby the magnetic sensor 10 can be reduced in size.

In the first embodiment, for heating the GMR elements, a 100 mA current is supplied to the heating coils 21-24 in sequence for 100 ms each; alternatively, for example, a 25 mA current may be supplied to all of the heating coils 21-24 simultaneously for 400 ms. In this simultaneous energization, a better temperature balance between the heating coils 21-24 can be achieved as compared with the case of the sequential energization.

Second Embodiment

A magnetic sensor 50 according to a second embodiment of the present invention will now be described with reference to FIG. 14, which shows a plan view of the magnetic sensor 50, and FIG. 15, which is a partial cross-sectional view of the magnetic sensor 50 taken along line 1-1 of FIG. 14. The magnetic sensor 50 is identical in configuration with the magnetic sensor 10 of the first embodiment, except that a heating coil 70 for heating GMR elements 11-18 (element groups Gr1-Gr4) is mounted independently of initialization coils 61-64. Therefore, the following description will focus largely on this modified point.

Figure 14:
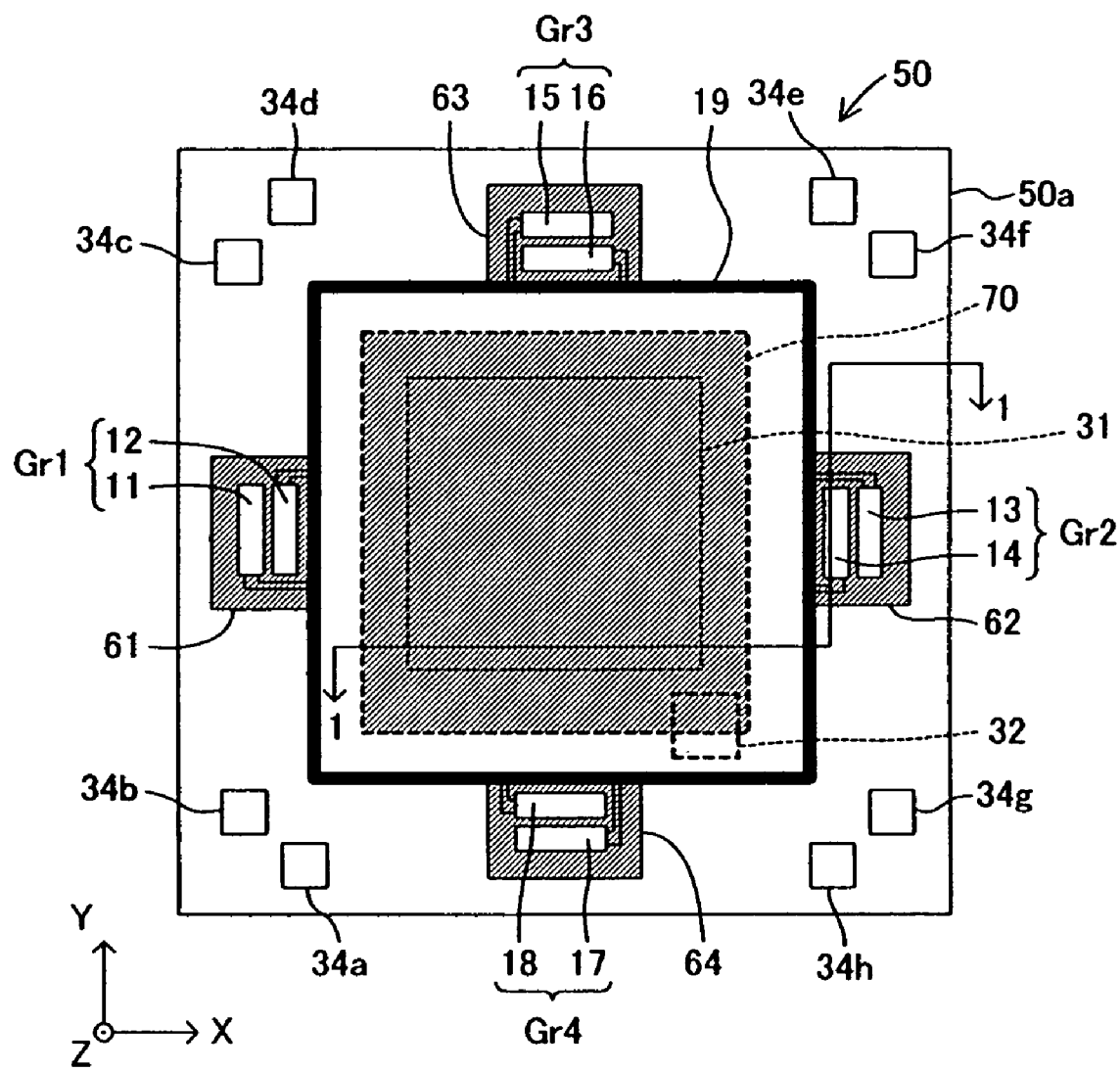
FIG. 14 is a schematic plan view of a magnetic sensor according to a second embodiment of the present invention.
Figure 15:
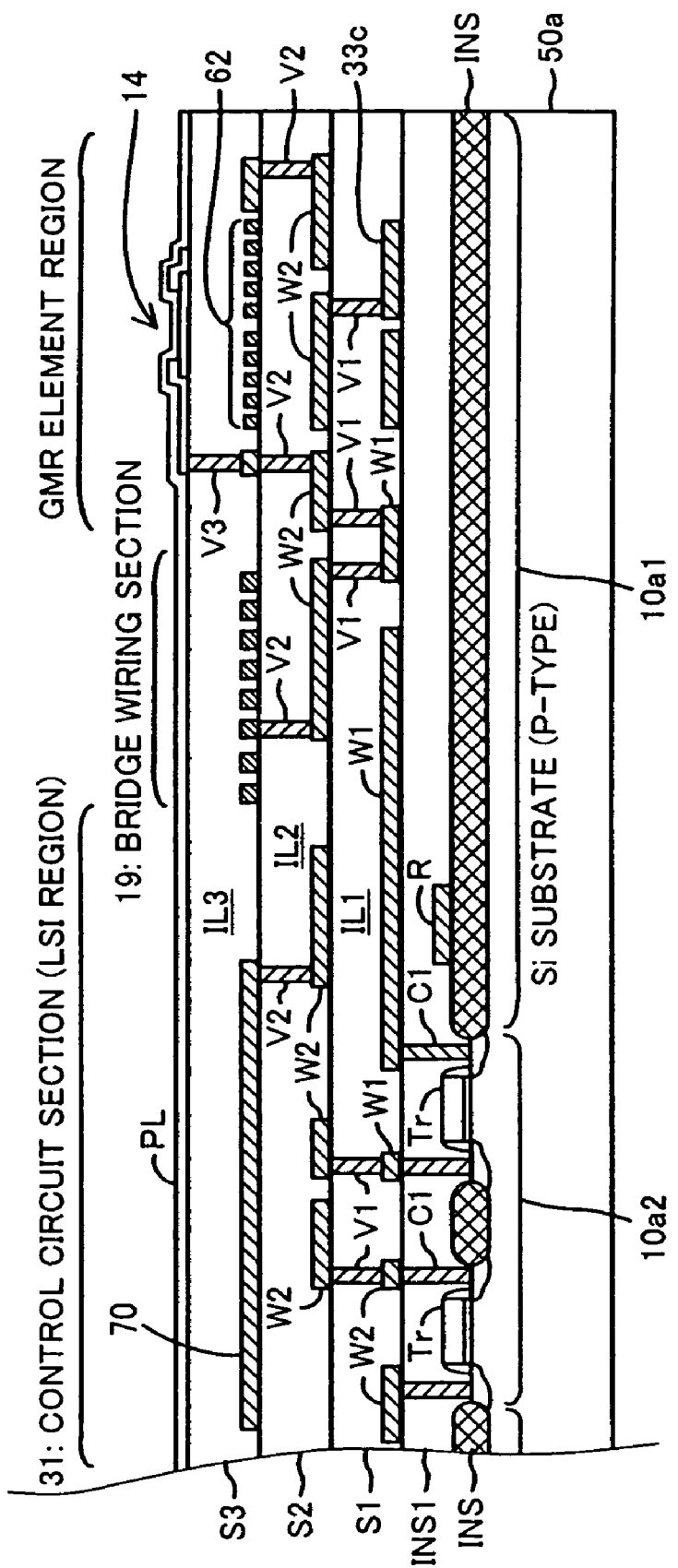
FIG. 15 is a cross-sectional view of a portion of the magnetic sensor, taken along 1-1 line in FIG. 14.

Like the corresponding heating coils 21-24, the initialization coils 61-64 of FIGS. 14 and 15 are embedded in the layer S3 directly beneath the element groups Gr1-Gr4, respectively (in the negative Z direction). When electrically energized under a predetermined condition (e.g., before the detection of magnetism), the initialization coils 61-64 generate, in each of the free layers of the magnetoresistive elements located above the respective heating coils, a magnetic field (an initializing magnetic field) of a predetermined direction (direction perpendicular to the direction of pinned magnetization of the corresponding pinned layer).

The heating coil 70 assumes the form of, for example, a thin layer of aluminum and has a spiral shape (not shown) as viewed in plan. The shape of the heating coil 70 approximates a square whose sides are parallel to the corresponding sides of a square defined by a bridge wiring section 19 and whose centroid is aligned with the centroid of the square of the bridge wiring section 19. The heating coil 70 is formed inside the bridge wiring section 19 as viewed in plan. Further, as is understood from FIG. 15, the heating coil 70 is embedded and formed in, among an insulating layer INS1 and wiring layers S1-S3 superposed in sequence on a substrate 50a, a layer S3 (the uppermost layer of the layers S1-S3 functioning as the wiring layers) on the upper surface on which the GMR elements 11-18 are formed.

Further, the heating coil 70 is configured in such a manner that a quantity of heat to be propagated from the heating coil 70 to an arbitrary one of the plurality of GMR elements 11-18 is approximately equal to the quantity of heat to be propagated from the heating coil 70 to another of the plurality of magnetoresistive elements 11-18.

Figure 16:
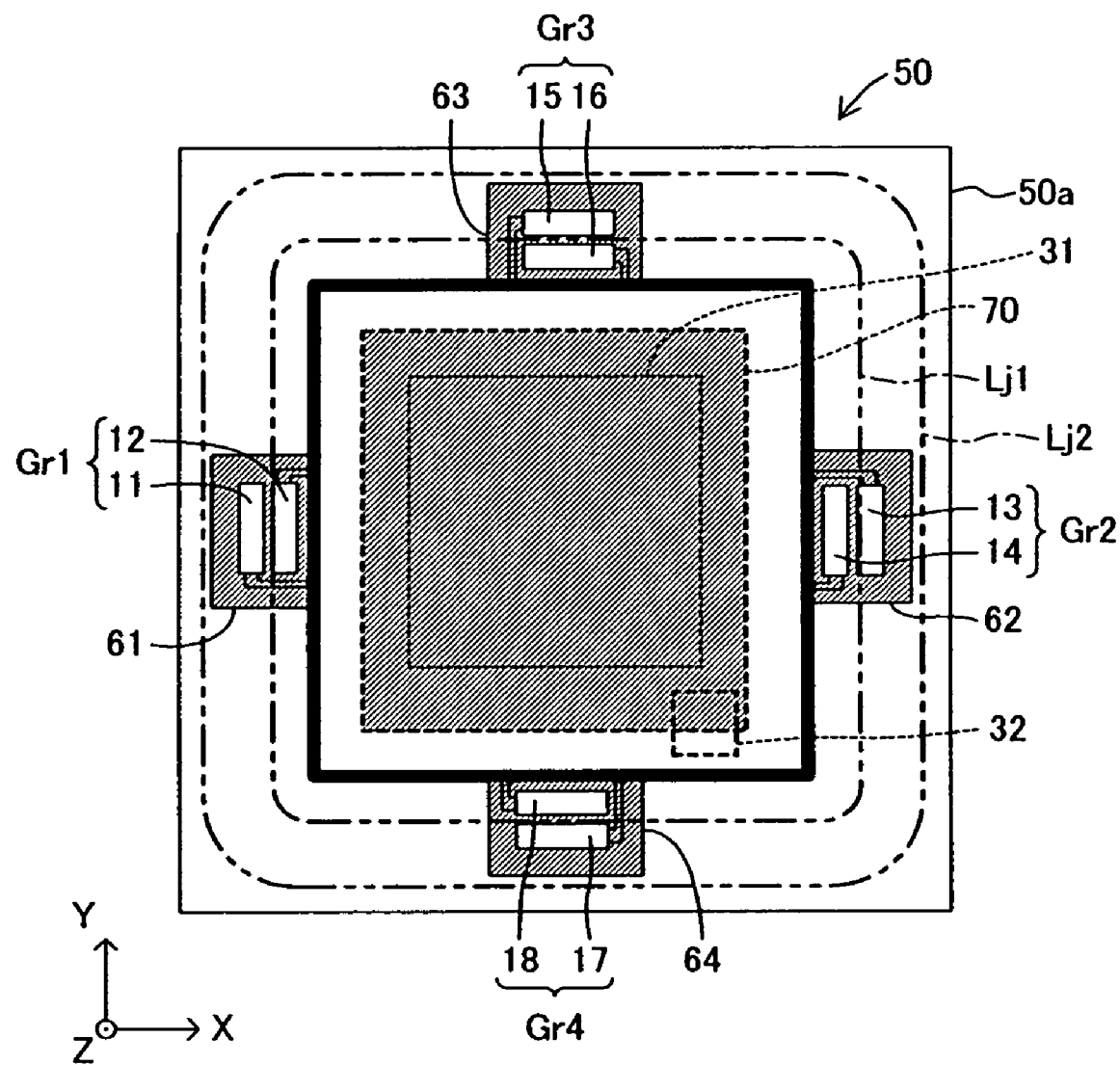
FIG. 16 is a schematic plan view of the magnetic sensor of FIG. 14, showing isothermal lines when heating coils of the magnetic sensor are electrically energized.

In this magnetic sensor 50, as in the magnetic sensor 10, compensation of temperature-dependent characteristic is carried out. Namely, in a stage in which the magnetic sensor has not yet been mounted in the cellular phone, the heating coils 70 are electrically energized to obtain the above-described ratios (gradients) Mx and My, which are the basic data for compensation of temperature-dependent characteristic. FIG. 16 shows isothermal lines on the surface on which the element groups Gr1-Gr4 are formed, by curves Lj1 and Lj2. The temperature of the isothermal line represented by the curve Lj1 is higher than the temperature of the isothermal line represented by the curve Lj2.

Namely, when electrically energized, the heating coil 70 heats mainly the element groups Gr1-Gr4. As a result, the element groups Gr1-Gr4 become approximately equal in temperature. In contrast, when the element groups Gr1-Gr4 are heated to a temperature sufficiently high to obtain the basic data for compensation of temperature-dependent characteristic, the whole magnetic sensor 50 including the substrate 50a is not uniformly heated, so that the upper surface of the layer S3 on which surface the element groups Gr1-Gr4 are formed becomes nonuniform in temperature due to the generation of heat by the heating coil 70.

In other words, in the magnetic sensor 50, when the basic data for compensation of temperature-dependent characteristic are obtained, the GMR elements 11-18 are not heated (do not need to be heated) to such a temperature that the entire magnetic sensor 50 including the substrate 50a attains a uniform temperature. Therefore, the period of time needed for the heating/cooling of the GMR elements 11-18 can be shortened, as compared with the case in which the entire magnetic sensor 50 is heated by a heating device.

Therefore, according to the magnetic sensor 50, the basic data for compensation of temperature-dependent characteristic can be obtained within a short period of time, within which geomagnetism is very unlikely to change, whereby the data can be obtained with precision. As a result, the temperature-dependent characteristic of the magnetic sensor 50 can be compensated accurately.

Further, because the magnetic sensor 50 can be cooled within a short time as compared with the case in which the magnetic sensor 50 is cooled after having been heated by use of a heating device, the period of time required for fabricating the magnetic sensor 50 can be shortened, and the manufacturing cost can be lowered. Furthermore, because the heating coil 70 is embedded in the layer S3, which is the uppermost one of the three wiring layers S1-S3 and is closest to the GMR elements 11-18, the GMR elements 11-18 can be heated efficiently.

Alternatively, instead of the above-mentioned initialization coils 61-64, the above-mentioned test coil may be disposed in the same region which had been occupied by the initialization coils. As another alternative, the test coil may be formed independently of the initialization coils 61-64 and the heating coil 70 so as to be located directly beneath the initialization coils 61-64. As still another alternative, the initialization coils may be formed in a lower layer, such as the layer S1, while the test coil may be formed in an upper layer, such as the layer S3.

As is described hereinabove, with the magnetic sensor and the method for compensation of temperature-dependent characteristic of a magnetic sensor according to the present invention, the temperature-dependent characteristic of the magnetic sensor can be compensated accurately. Further, in consideration of the fact that the magnetic sensor 10, 50 including the X- and Y-axis magnetic sensors is configured in the form of a full-bridge circuit, and the temperature-dependent characteristic of the magnetic sensor changes in proportion to the variations in temperature of the magnetoresistive element, the above-mentioned "ratios" Mx, My are stored in a WORM memory of the magnetic sensor. Therefore, after the magnetic sensor is mounted in an electronic apparatus, the electronic apparatus can read the "ratios" from the memory to thereby obtain data of the temperature-dependent characteristic of the magnetic sensor, and can compensate the temperature-dependent characteristic of the magnetic sensor by use of the obtained data.

Further, because data of the temperature-dependent characteristic of each magnetic sensor 10, 50 can be saved in the magnetic sensor by storing merely the above-mentioned "ratios" (gradients Mx, My) into the memory of the magnetic sensor 10 or 50, the quantity of data to be stored in the memory can be minimized as compared with the case in which a plurality of data sets each including an element temperature and a magnetic sensor output are stored in a memory. Furthermore, because the above-mentioned "ratios" (gradients Mx and My) do not change, the memory may be of a WORM type, which is inexpensive. As a consequence of the foregoing, the cost of the magnetic sensor can be lowered.

The present invention is not limited to the foregoing embodiments, and various modifications may be possible within the scope of the invention. For example, for the magnetoresistive elements of the magnetic sensor 10 or 50, TMR elements may be used instead of the GMR elements. Further, an electronic apparatus in which the magnetic sensor 10 or 50 is to be mounted is not limited to a cellular phone. Namely, they can be accommodated in another electronic apparatus, such as a mobile computer, a portable navigation system, or a PDA (personal information equipment called a "Personal Digital Assistant").

Further, in each of the foregoing embodiments, the first temperature T1 of the GMR element 18, the first output value X1 of the X-axis magnetic sensor, and the first output value Y1 of the Y-axis magnetic sensor are obtained before electrical energization of the heating coils 21-24 or 70; and the second temperature T2 of the GMR element 18, the second output value X2 of the X-axis magnetic sensor, and the second output value Y2 of the Y-axis magnetic sensor are obtained after electrical energization of the heating coils 21-24 or 70; whereupon the gradients Mx, My are calculated. However, the embodiment may be modified in such a manner that the first temperature T1 of the GMR element 18, the first output value X1 of the X-axis magnetic sensor, and the output value Y1 of the Y-axis magnetic sensor are obtained after electrical energization of the heating coils 21-24 or 70; the second temperature T2 of the GMR element 18, the second output value X2 of the X-axis magnetic sensor, and the second output value Y2 of the Y-axis magnetic sensor are obtained after lapse of a predetermined time from termination of the electrical energization of the heating coils 21-24 or 70; and then the gradients Mx and My are calculated.

Figure 17:
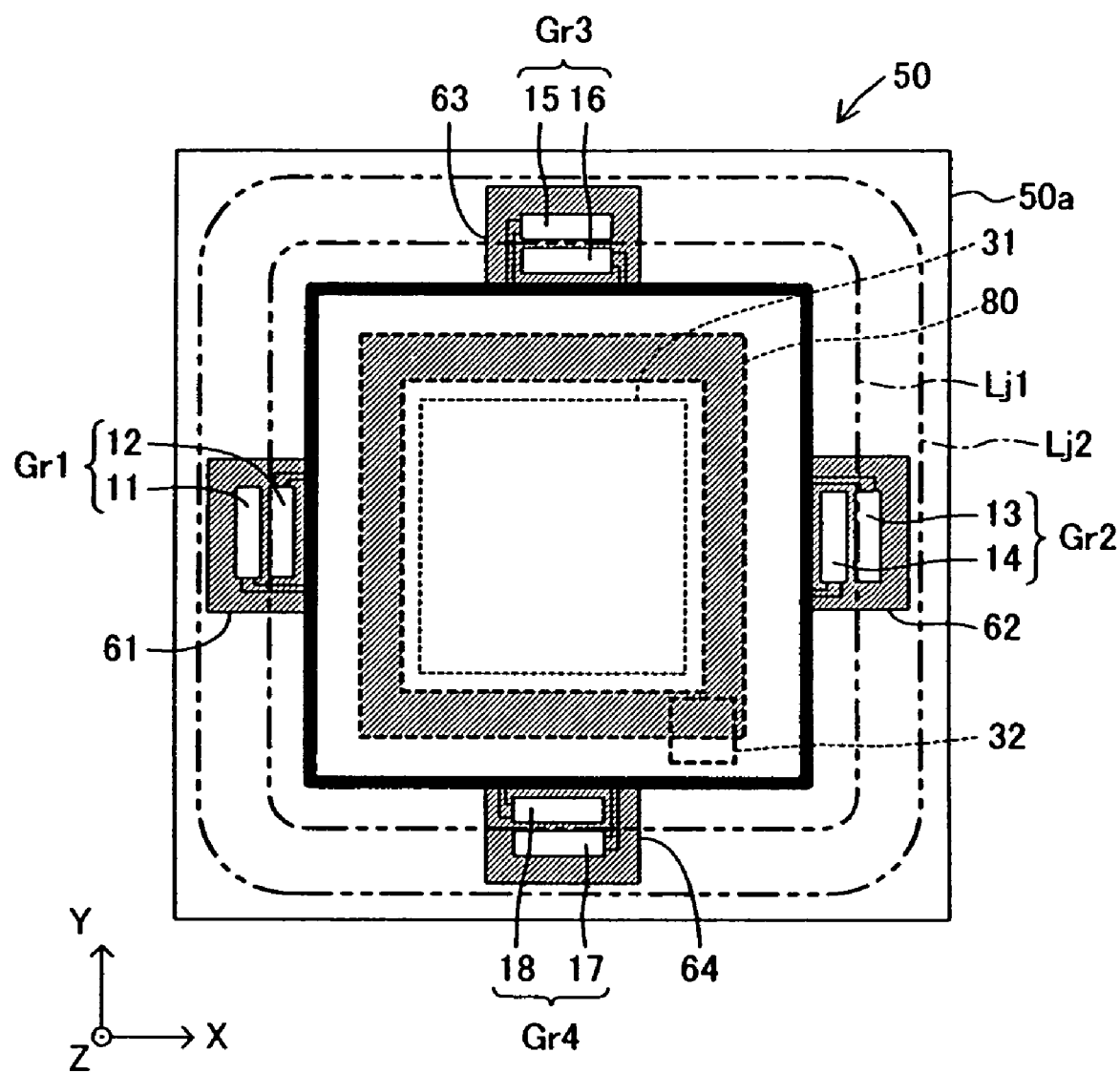
FIG. 17 is a schematic plan view of a magnetic sensor according to a modification of the second embodiment of the present invention, showing isothermal lines when heating coils of the magnetic sensor are electrically energized.

Furthermore, as shown in FIG. 17, the heating coil 70 of the second embodiment may be substituted by a heating coil 80 having a pattern with a cutout corresponding to a central portion of the heating coil 70. According to this alternative heating coil 80, the magnetoresistive elements 11-18 can be heated to approximately the same temperature when the heating coil 80 is electrically energized; and the central portion of the magnetic sensor 50 (substrate 50a) is not overheated. Therefore, the GMR elements 11-18 can be heated with increased efficiency.

Figure 18:
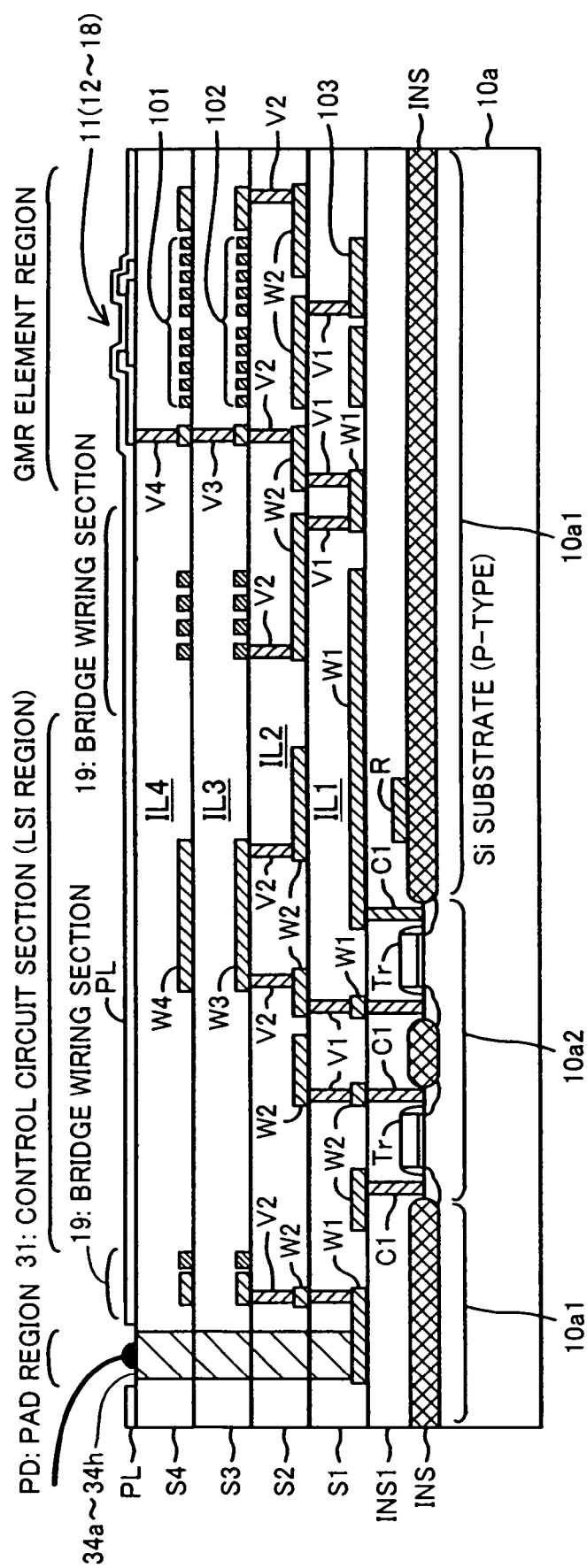
FIG. 18 is a schematic cross-sectional view of another modification of the magnetic sensor according to the present invention.

Still further, the heating coil, the initialization coil, and the test coil may be formed independently of one another so as to be superposed one over another at a position directly beneath each GMR element group. In this case, as shown better in FIG. 18, the layer INS1 and the four wiring layers S1-S4 are superposed one over another in sequence on the substrate; and a heating coil 101, an initialization coil 102, and a test coil 103 may be formed in the layer S4, the layer S3, and the layer S1, respectively. Further, the bridge wiring may extend across a plurality of layers.

In addition, the present invention can be employed not only in a double-axis-direction-detecting-type magnetic sensor equipped with X- and Y-axis magnetic sensors, but also in a triple-axis-direction-detecting-type magnetic sensor equipped with X-, Y-, and Z-axis magnetic sensors or a single-axis-direction-detecting-type magnetic sensor.

What is claimed is:

1. A magnetic sensor comprising a substrate, a plurality of magnetoresistive elements disposed at an upper portion of said substrate, bridge circuits disposed at the upper portion of said substrate and bridge-interconnecting said plurality of magnetoresistive elements, and a control circuit section for obtaining via said bridge circuits a physical quantity determined on the basis of resistance values of said plurality of magnetoresistive elements and processing the physical quantity so as to generate an output signal to be output to the outside, wherein said substrate has an approximately square or rectangular shape with sides extending along mutually perpendicular X- and Y-axes;

each of said plurality of magnetoresistive elements is disposed at a peripheral portion of said substrate and in vicinity of an approximate center of each of said sides of said substrate;

each of said bridge circuits is disposed inside said plurality of magnetoresistive elements so as to form substantially a closed curve having sides along the X-axis and the Y-axis as viewed in plan; and said control circuit section is disposed substantially inside said closed curve formed by the bridge circuits as viewed in plan.

2. A magnetic sensor according to claim 1, wherein said plurality of magnetoresistive elements are interconnected by said bridge circuits to constitute two full-bridge circuits.

3. A magnetic sensor according to claim 1, wherein said plurality of magnetoresistive elements includes first to fourth X-axis magnetoresistive elements that are interconnected by said bridge circuits to constitute a full-bridge circuit which is an X-axis magnetic sensor whose magnetic field detecting direction is the X-axis direction and first to fourth Y-axis magnetoresistive elements that are interconnected by said bridge circuits to constitute another full-bridge circuit which is a Y-axis magnetic sensor whose magnetic field detecting direction is the Y-axis direction.

4. A magnetic sensor according to claim 1 further comprising:

temperature detecting section for outputting a temperature as a detection temperature, said temperature detecting section being disposed substantially inside said closed curve as viewed in plan.

5. A magnetic sensor according to claim 4 further comprising:

a plurality of pads for connecting said magnetic sensor with external equipment via wires, said pads being disposed substantially outside said closed curve as viewed in plan.

6. A magnetic sensor according to claim 1, wherein said control circuit section includes an analog-to-digital converter.

7. A magnetic sensor according to claim 6, wherein said control circuit section performs analog-to-digital conversion by said analog-to-digital converter for obtaining said physical quantity so as to generate said output signal.

8. A magnetic sensor according to claim 1, wherein said control circuit section includes a memory.

9. A magnetic sensor according to claim 8, wherein said memory is a WORM memory capable of writing data once and reading the data many times.

10. A magnetic sensor according to claim 1 further comprising:

a plurality of layers superposed on said substrate; and a connecting section which interconnects said bridge circuits with said control circuit section.

11. A magnetic sensor according to claim 10, wherein said connecting section is formed of a conductive substance and extends along a direction intersecting layer surfaces of said layers.

* * * * *